US010347672B2

(12) United States Patent
Lee et al.

(10) Patent No.: US 10,347,672 B2
(45) Date of Patent: Jul. 9, 2019

(54) IMAGE SENSOR HAVING AN INTERCONNECTION COVERING A BLACK PIXEL REGION SURROUNDING AN ACTIVE PIXEL REGION

(71) Applicant: SAMSUNG ELECTRONICS CO., LTD., Suwon-si, Gyeonggi-Do (KR)

(72) Inventors: Gwi-Deok Ryan Lee, Suwon-si (KR); Kwang-Min Lee, Seoul (KR); Beom-Suk Lee, Yongin-si (KR); Tae-Yon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/653,537

(22) Filed: Jul. 19, 2017

(65) Prior Publication Data

US 2018/0190696 A1    Jul. 5, 2018

(30) Foreign Application Priority Data

Dec. 30, 2016  (KR) .......................... 10-2016-0184355

(51) Int. Cl.
  *H01L 27/28*    (2006.01)
  *H01L 27/146*   (2006.01)
  *H01L 27/30*    (2006.01)

(52) U.S. Cl.
  CPC .... *H01L 27/14609* (2013.01); *H01L 27/1463* (2013.01); *H01L 27/14603* (2013.01);
  (Continued)

(58) Field of Classification Search
  CPC ......... H01L 27/14645; H01L 27/14647; H01L 27/14667; H01L 27/307; H01L 27/14636
  See application file for complete search history.

(56) References Cited

U.S. PATENT DOCUMENTS 8,492,864 B2 *   7/2013  Watanabe ........... H01L 27/1464
                                                              257/435
9,006,566 B2     4/2015  Ihama
(Continued)

FOREIGN PATENT DOCUMENTS

JP       2014204102 A    10/2014
JP       2015070060 A     4/2015

*Primary Examiner* — Marc Anthony Armand
*Assistant Examiner* — Younes Boulghassoul
(74) *Attorney, Agent, or Firm* — Volentine, Whitt & Francos, PLLC

(57) ABSTRACT

An image sensor of reduced chip size includes a semiconductor substrate having an active pixel region in which a plurality of active pixels are disposed and a power delivery region in which a pad is disposed. A plurality of first transparent electrode layers is disposed over the semiconductor substrate, respectively corresponding to the plurality of active pixels. A second transparent electrode layer is integrally formed across the active pixels. An organic photoelectric layer is disposed between the plurality of first transparent electrode layers and the second transparent electrode layer. An interconnection layer is located at a level that is the same as or higher than an upper surface of the pad with respect to an upper main surface of the semiconductor substrate. The interconnection layer extends from the pad to the second transparent electrode layer, and includes a connector electrically connecting the pad and the second transparent electrode layer.

19 Claims, 17 Drawing Sheets

(52) U.S. Cl.
CPC .. *H01L 27/14623* (2013.01); *H01L 27/14636* (2013.01); *H01L 27/14641* (2013.01); *H01L 27/14645* (2013.01); *H01L 27/14647* (2013.01); *H01L 27/14667* (2013.01); *H01L 27/14683* (2013.01); *H01L 27/28* (2013.01); *H01L 27/307* (2013.01)

(56) References Cited

U.S. PATENT DOCUMENTS

| | | | |
|---|---|---|---|
| 9,252,169 B2 | 2/2016 | Kobayashi et al. | |
| 9,293,722 B2 | 3/2016 | Miyanami | |
| 9,300,891 B2 | 3/2016 | Isono et al. | |
| 2006/0118795 A1* | 6/2006 | Araki | H01L 27/14634 257/83 |
| 2006/0154034 A1* | 7/2006 | Araki | H01L 27/14632 428/209 |
| 2007/0012955 A1* | 1/2007 | Ihama | H01L 27/14621 257/233 |
| 2007/0045760 A1* | 3/2007 | Ihama | H01L 27/14667 257/431 |
| 2009/0134485 A1* | 5/2009 | Lee | H01L 27/14667 257/448 |
| 2011/0228150 A1* | 9/2011 | Takata | H01L 27/307 348/294 |
| 2012/0217498 A1 | 8/2012 | Yamanaka et al. | |
| 2012/0286137 A1* | 11/2012 | Yamaguchi | H01L 27/14607 250/208.1 |
| 2015/0002719 A1* | 1/2015 | Isono | H01L 27/14683 348/311 |
| 2015/0048317 A1* | 2/2015 | Sasaki | H01L 27/14625 257/40 |
| 2015/0115243 A1* | 4/2015 | Miyanami | H01L 27/307 257/40 |
| 2015/0311259 A1 | 10/2015 | Joei | |
| 2016/0133865 A1* | 5/2016 | Yamaguchi | H01L 27/14623 257/40 |

* cited by examiner

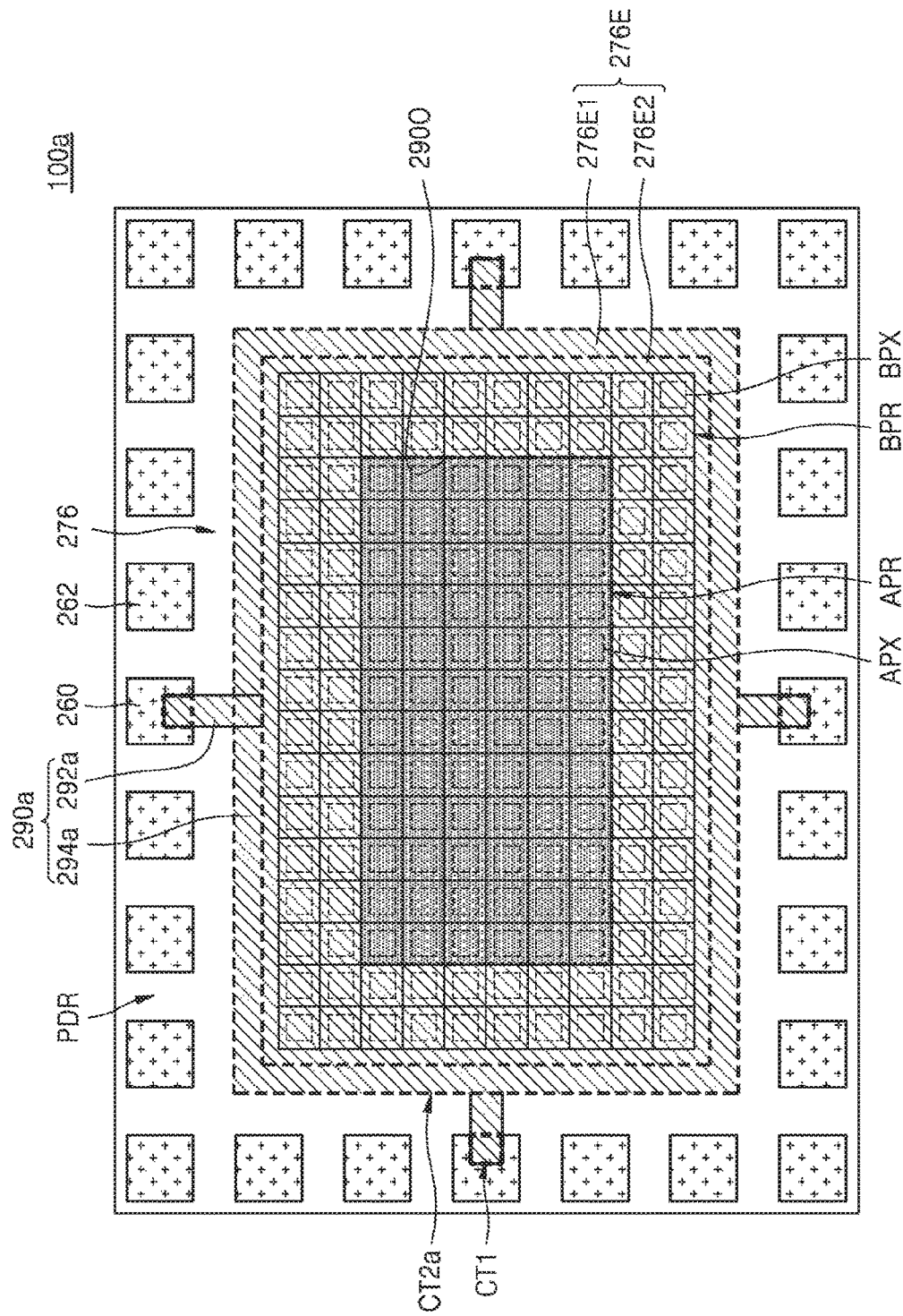

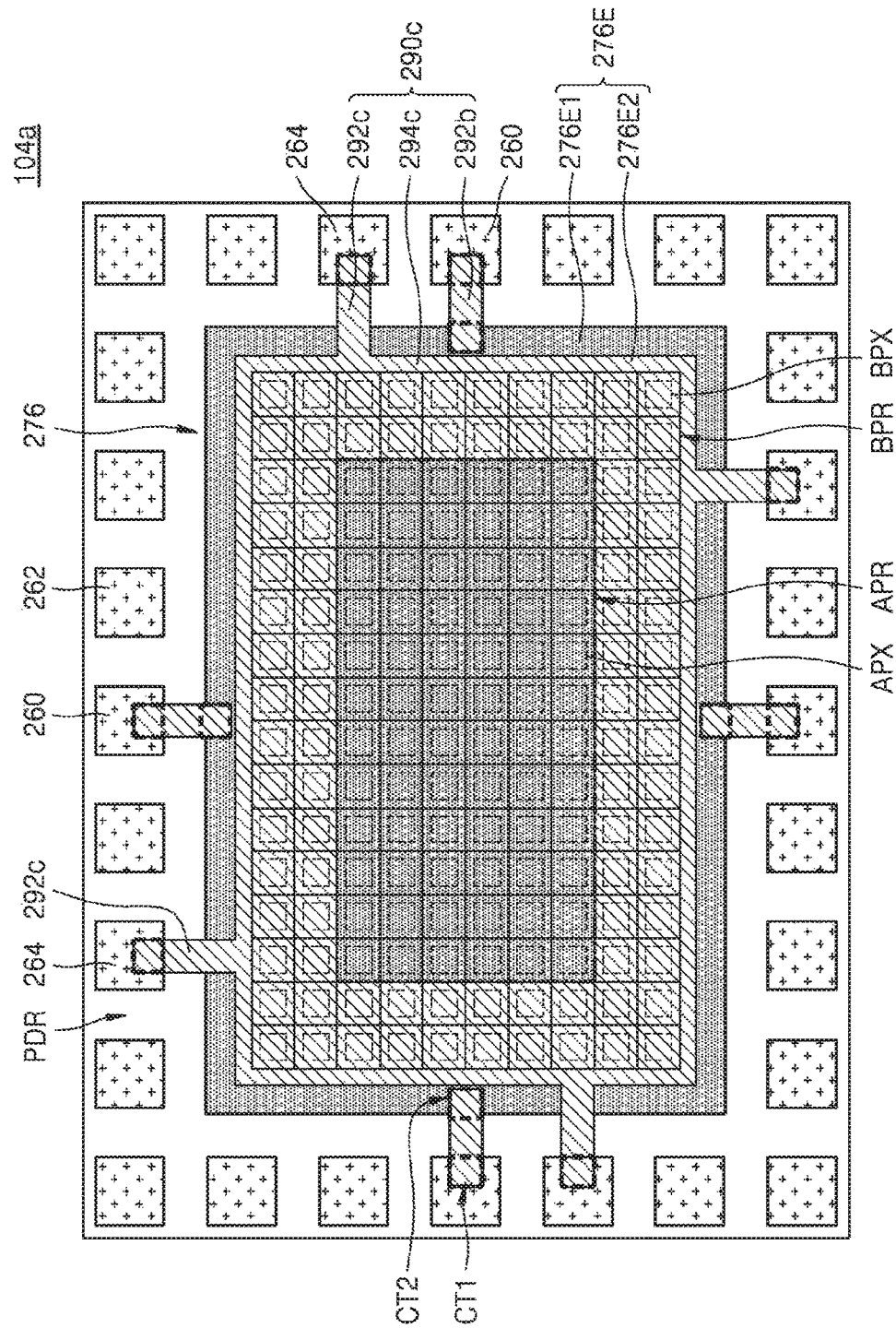

IMAGE SENSOR HAVING AN INTERCONNECTION COVERING A BLACK PIXEL REGION SURROUNDING AN ACTIVE PIXEL REGION

CROSS-REFERENCE TO RELATED APPLICATION

A claim for priority under 35 U.S.C. § 119 is made to Korean Patent Application No. 10-2016-0184355, filed on Dec. 30, 2016, in the Korean Intellectual Property Office, the disclosure of which is incorporated herein in its entirety by reference.

BACKGROUND

The inventive concepts described herein relate to an image sensor, and more particularly, to an image sensor having an organic photoelectric layer.

Image sensors convert images into electric signals and are typically used in consumer electronic devices such as digital cameras, cameras in cellular phones, and portable camcorders for example. Image sensors may also be used in cameras mounted in/on automobiles, security systems, and robots for example.

As technology has recently advanced, there has been greater demand to provide image sensors having increased miniaturization and resolution. Image sensors including organic photoelectric layers have thus been introduced in an effort to reduce the size of pixels to meet the demand to provide increased miniaturization and resolution.

SUMMARY

Embodiments of the inventive concepts provide image sensors having an organic photoelectric layer capable of reducing a chip size.

Embodiments of the inventive concepts provide an image sensor including a semiconductor substrate having an active pixel region in which a plurality of active pixels are disposed and a power delivery region in which a pad is disposed; a plurality of first transparent electrode layers disposed over the semiconductor substrate and respectively corresponding to the plurality of active pixels; a second transparent electrode layer integrally formed across the plurality of active pixels; an organic photoelectric layer disposed between the plurality of first transparent electrode layers and the second transparent electrode layer; and an interconnection layer located at a level that is the same as or higher than an upper surface of the pad with respect to an upper main surface of the semiconductor substrate, the interconnection layer extending from the pad to the second transparent electrode layer, and comprising a connector electrically connecting the pad and the second transparent electrode layer.

Embodiments of the inventive concepts also provide an image sensor including a semiconductor substrate having an active pixel region in which a plurality of active pixels are disposed, a black pixel region in which a plurality of black pixels are disposed and that surrounds the active pixel region, and a power delivery region in which a plurality of pads including a DC pad are disposed and that surrounds the black pixel region; a plurality of first transparent electrode layers disposed over the semiconductor substrate and respectively corresponding to the plurality of active pixels; a second transparent electrode layer integrally formed across a part of the power delivery region, the black pixel region, and the active pixel region; an organic photoelectric layer disposed between the plurality of first transparent electrode layers and the second transparent electrode layer; and an interconnection layer located at a level higher than an upper main surface of the semiconductor substrate, and extending from the DC pad to the second transparent electrode layer, the interconnection layer comprising a connector electrically connecting the DC pad and the second transparent electrode layer, and a cover covering the black pixel region.

Embodiments of the inventive concepts still further provide an image sensor including a semiconductor substrate having an active pixel region in which a plurality of active pixels are disposed and a power delivery region in which a pad is disposed; a first photolayer disposed over the semiconductor substrate and including a plurality of first lower transparent electrode layers respectively corresponding to the plurality of active pixels, a first upper transparent electrode layer integrally formed across the plurality of active pixels, and a first organic photoelectric layer disposed between the plurality of first lower transparent electrode layers and the first upper transparent electrode disposed; a second photolayer disposed over the first photolayer and including a plurality of second lower transparent electrode layers respectively corresponding to the plurality of active pixels, a second upper transparent electrode layer integrally formed across the plurality of active pixels, and a second organic photoelectric layer disposed between the plurality of second lower transparent electrode layers and the second upper transparent electrode layer; a third photolayer disposed over the second photolayer and including a plurality of third lower transparent electrode layers respectively corresponding to the plurality of active pixels, a third upper transparent electrode layer integrally formed across the plurality of active pixels, and a third organic photoelectric layer disposed between the plurality of third lower transparent electrode layers and the third upper transparent electrode layer; and an interconnection layer located at a level that is higher than an upper surface of the pad with respect to an upper main surface of the semiconductor substrate, the interconnection extending from the pad, and comprising a connector electrically connecting the pad and the first upper transparent electrode layer, the second upper transparent electrode layer and the third upper transparent electrode layer.

BRIEF DESCRIPTION OF THE DRAWINGS

Embodiments of the inventive concepts will be more clearly understood from the following detailed description taken in conjunction with the accompanying drawings in which:

FIG. 2B illustrates a plan layout diagram of a main portion of an image sensor according to an embodiment of the inventive concepts;

FIG. 6B illustrates a plan layout diagram of a main portion of an image sensor according to another embodiment of the inventive concepts;

DETAILED DESCRIPTION

The inventive concepts will now be described more fully with reference to the accompanying drawings in which exemplary embodiments of the inventive concepts are shown. In the attached drawings, sizes of structures may be exaggerated for clarity.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
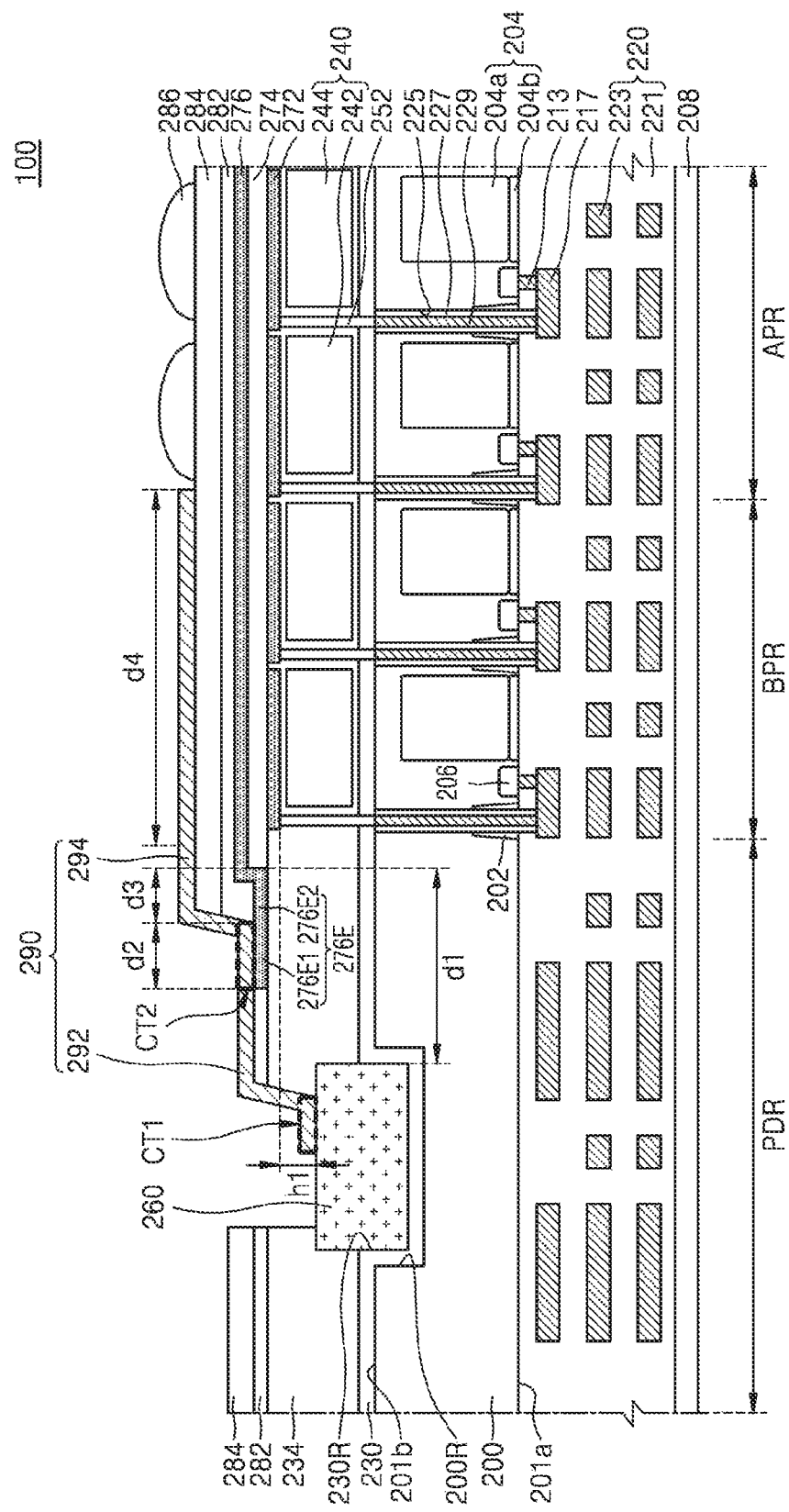
FIG. 1 illustrates a cross-sectional view illustrating a main portion of an image sensor according to an embodiment of the inventive concepts.

FIG. 1 illustrates a cross-sectional view of a main portion of an image sensor 100 according to an embodiment of the inventive concepts.

Referring to FIG. 1, the image sensor 100 includes a semiconductor substrate 200 including an active pixel region APR, a black pixel region BPR, and a power delivery region PDR. A device isolation layer 202 may be disposed on the semiconductor substrate 200. The device isolation layer 202 may define a unit pixel region in each of the active pixel region APR and the black pixel region BPR. For example, in FIG. 1, the unit pixel region may mean a portion of the image sensor 100 disposed between the two adjacent device isolation layers 202.

As described with respect to the present disclosure, the unit pixel region means a region in which two or three photodiodes are stacked in a vertical direction such that light of two or three different wavelength bands may be detected. In some embodiments of the inventive concepts, the unit pixel region may include a first unit pixel region in which red light and green light may be detected, and a second unit pixel region in which blue light and green light may be detected. Two unit pixel regions, i.e., the first and second unit pixel regions, may form one color pixel. In some embodiments, the unit pixel region may detect blue light, red light, and green light so that one unit pixel region may form one color pixel. For example, image sensors according to embodiments described with reference to FIGS. 1 through 7B may detect light of two different wavelength bands in one unit pixel region, and image sensors according to embodiments described with reference to FIGS. 8 through 11B may detect light of three different wavelength bands in one unit pixel region.

The semiconductor substrate 200 may be, for example, one of a bulk substrate, an epitaxial substrate, and a silicon on insulator (SOI) substrate. The semiconductor substrate 200 may include, for example, silicon. Alternatively, the semiconductor substrate 200 may include a semiconductor element such as germanium (Ge) or a compound semiconductor such as silicon carbide (SiC), gallium arsenide (GaAs), indium arsenide (InAs), and indium phosphide (InP). The semiconductor substrate 200 may be formed based on a first conductive semiconductor substrate. In the description that follows, the semiconductor substrate 200 is a P-type semiconductor substrate, although in other embodiments of the inventive concepts the semiconductor substrate 200 may be an N-type semiconductor substrate.

A plurality of photoelectric transducers 204 may be disposed in the semiconductor substrate 200 of the active pixel region APR and the black pixel region BPR. In some embodiments, one photoelectric transducer 204 may be disposed in a unit pixel region. The photoelectric transducer 204 may be a photodiode. The photoelectric transducer 204 includes a first impurity region 204a and a second impurity region 204b. The first impurity region 204a may be formed deeply from a first surface 201a of the semiconductor substrate 200. The second impurity region 204b may be formed shallowly in the first surface 201a of the semiconductor substrate 200. The first impurity region 204a and the second impurity region 204b may include different conductive types. For example, the first impurity region 204a may be doped with N-type impurities, and the second impurity region 204b may be doped with P-type impurities.

A storage node region 206 is disposed in the semiconductor substrate 200 adjacent to each of the photoelectric transducers 204, with the storage node regions 206 being spaced apart from each of the photoelectric transducers 204. The storage node region 206 may be, for example, doped with N-type impurities. The storage node region 206 may be formed as a single doped region. The storage node region 206 may have a smaller region than that of each of the photoelectric transducers 204.

An interconnection structure 220 is disposed on the first surface 201a of the semiconductor substrate 200. The interconnection structure 220 may include a front interlayer dielectric 221 and a plurality of front wires 223. The front interlayer dielectric 221 may for example be a high density plasma (HDP) oxide film, a tetraethyl orthosilicate (TEOS) oxide film, tonen silazen (TOSZ), spin on glass (SOG), undoped silica glass (USG), a low-k dielectric layer, or the like. The plurality of front wires 223 may be formed of, for example, a metallic material such as copper (Cu), aluminum (Al), nitride titanium (TiN), or tungsten (W) or a conductive metal nitride.

In some embodiments, a supporting layer 208 may be adhered to the interconnection structure 220. The supporting layer 208 may be used to provide strength to the semiconductor substrate 200 which is thinned through a polishing process. The supporting layer 208 may be formed of, for example, a silicon oxide, a silicon nitride, and/or a semiconductor material. In some embodiments, the support layer 208 may be omitted.

The interconnection structure 220 includes a first contact via 213 that is in contact with the storage node region 206 and extends into the interconnection structure 220, and a buffer layer 217 that is in contact with the first contact via 213. Therefore, the buffer layer 217 may be electrically connected to the storage node region 206 formed on the semiconductor substrate 200 through the first contact via 213. The buffer layer 217 may be formed of, for example, a metallic material such as copper (Cu), aluminum (Al), titanium (Ti), nitride titanium (TiN), conductive metallic nitride such as nitride titanium (TiN), or carbon nanotubes, among other materials.

In some embodiments, a horizontal cross section of the first contact via 213 may gradually increase further away from the first surface 201a of the semiconductor substrate 200. That is, the cross section of the first contact via 213 may be greater nearer to the buffer layer 217 than adjacent to the first surface 201a of the semiconductor substrate 200. The first contact via 213 may be formed of, for example, a metallic material such as copper (Cu), aluminum (Al), nitride titanium (TiN), or tungsten (W) or a conductive metal nitride, among other materials. In some embodiments, a protection insulating layer (not shown) may be disposed between the first contact via 213 and the front interlayer dielectric 221. The protection insulating layer may include for example an oxide or a nitride.

A via hole 225 penetrates and extends through the semiconductor substrate 200 from a second surface 201b of the semiconductor substrate 200 to the buffer layer 217 in the active pixel region APR and the black pixel region BPR of the image sensor 100. The second surface 201b may be characterized as an upper main surface of the semiconductor substrate 200. In some embodiments, a width of the via hole 225 may gradually increase approaching the second surface 201b of the semiconductor substrate 200 from the buffer layer 217. In some embodiments, the via hole 225 may be formed to penetrate the device isolation layer 202.

A surface insulating layer 227 may be formed on a surface of the via hole 225. The surface insulating layer 227 may for example be formed of an oxide or a nitride. The via hole 225 is filled with a first contact plug 229. The first contact plug 229 may completely fill the via hole 225 to be in contact with the side insulating layer 227. Thus, the first contact plug 229 may penetrate the semiconductor substrate 200. The first contact plug 229 may be, for example, formed of a metallic material such as copper (Cu), aluminum (Al), nitride titanium (TiN), or tungsten (W) or a conductive metal nitride, among other materials. The first contact plug 229 may hereinafter also be referred to as a first via plug 229.

A first recessed space 200R is formed in the power delivery region PDR of the semiconductor substrate 200 toward the inside of the semiconductor substrate 200 from the second surface 201b. An anti-reflection layer 230 may be formed to conformally cover an inner surface of the first recessed space 200R and the second surface 201b of the semiconductor substrate 200. The anti-reflection layer 230 may prevent the reflection of light toward the second surface 201b of the semiconductor substrate 200 from outside of the semiconductor substrate 200, to allow the light to be incident on the photoelectric transducers 204. The anti-reflection layer 230 may be formed of, for example, silicon oxynitride (SiON), SiC, silicon carbon nitride (SiCN), silicon oxycarbide (SiCO), or the like.

A second recessed space 230R may be formed in the first recessed space 200R and may be limited by the anti-reflection layer 230 covering the inner surface of the first recessed space 200R. In some embodiments, the anti-reflection layer 230 is not formed in the power delivery region PDR. In this case, the second recessed space 230R is not be formed.

A first pad 260 is formed on the semiconductor substrate 200 to fill the second recessed space 230R and partially protrude from an uppermost surface of the anti-reflection layer 230 in an upward direction. Thus, the first pad 260 may be disposed in the first recessed space 200R in some embodiments or in the second recessed space 230R in other embodiments, while in both cases an upper surface of the first pad 260 may be located at a higher level than that of the second surface 201b of the semiconductor substrate 200. The first pad 260 and a second pad 262 of FIGS. 2A and 2B may be formed of the same material. The first pad 260 and the second pad 262 may be formed of the same material as that of a third pad 264 of FIGS. 6A and 6B. The first pad 260, the second pad 262, and the third pad 264 substantially have the same shape, and thus detailed descriptions thereof are omitted here.

The first pad 260 may be, for example, formed of a metallic material such as copper (Cu), aluminum (Al), nitride titanium (TiN), or tungsten (W) or a conductive metal nitride among other materials. In some embodiments, when the anti-reflection layer 230 is not formed in the power delivery region PDR, the first pad 260 may fill the first recessed space 200R and partially protrude from the second surface 201b of the semiconductor substrate 200 in an upward direction.

The image sensor 100 may include a plurality of pads (260 and 262 of FIG. 2A or 2B) including the first pad 260. The first pad 260 may be a DC pad in which DC power is delivered from outside.

A color filter layer 240 is formed on the second surface 201b of the semiconductor substrate 200 with the anti-reflection layer 230 therebetween. The color filter layer 240 may allow light incident through a micro lens 286 to pass, thereby allowing only light with a necessary wavelength to be incident on the photoelectric transducers 204 through the second surface 201b.

In some embodiments, the color filter layer 240 may include a first color filter layer 242 and a second color filter layer 244. The first color filter layer 242 and the second color filter layer 244 may be disposed in a first unit pixel region and a second unit pixel region to correspond to the photoelectric transducers 204 formed therein, respectively. In some embodiments, the first color filter layer 242 disposed in the first unit pixel region may for example be a red (R) color filter and the second color filter layer 244 disposed in the second unit pixel region may for example be a blue (B) color filter. Accordingly, in the first unit pixel region, the first color filter layer 242 transmits light with a red wavelength to allow the red wavelength to arrive at the photoelectric transducers 204. Also, in the second unit pixel region, the second color filter layer 244 transmits light with a blue wavelength to allow the blue wavelength to arrive at the photoelectric transducers 204. In other embodiments, the first color filter layer 242 and the second color filter layer 244 may respectively be color filters other than a red (R) color filter and a blue (B) color filter.

A first cover insulating layer 234 is formed on the second surface 201b of the semiconductor substrate 200 to cover the color filter layer 240. A top surface of the first cover insulating layer 234 may have a higher level than that of a top surface of the first pad 260. The first cover insulating layer 234 does not cover at least a part of the top surface of the first pad 260. The first cover insulating layer 234 may include, for example, an oxide layer, a nitride layer, a low dielectric layer, a resin layer, or a combination of these.

In some embodiments, the first cover insulating layer 234 may have a multilayer structure. In some embodiments, a part of the first cover insulating layer 234 may be disposed between the color filter layer 240 and the anti-reflection layer 230. In some embodiments, the color filter layer 240 may be in contact with the anti-reflection layer 230.

A second via plug 252 is formed to penetrate the first cover insulating layer 234 and to be electrically connected with the first via plug 229. The second via plug 252 may extend from a top surface of the first cover insulating layer 234 to a bottom surface thereof. The second via plug 252 may be integrally formed from the top surface of the first cover insulating layer 234 to the bottom surface thereof but is not limited to such configuration. For example, the second via plug 252 may be formed as a multilayer structure from the top surface of the first cover insulating layer 234 to the bottom surface thereof. The second via plug 252 may be, for example, formed of a metallic material such as copper (Cu), aluminum (Al), nitride titanium (TiN), or tungsten (W) or a conductive metal nitride among other materials. At least a part of the second via plug 252 may be formed of a transparent conductive material. In some embodiments, the second via plug 252 may include a part formed of a metallic material and another part formed of a transparent conductive material disposed on the part formed of the metallic material. The part of the second via plug 252 formed of the transparent conductive material may be integrally formed with a lower transparent electrode layer 272 that will be described later. In this case, the second via plug 252 may refer to a part of a conductive material that extends from the lower transparent electrode layer 272 to the second surface 201b of the semiconductor substrate 200 and electrically connects the lower transparent electrode layer 272 and the first via plug 229.

The lower transparent electrode layer 272, which may be characterized as a first transparent electrode layer, is formed on the first cover insulating layer 234. The lower transparent electrode layer 272 may thus be characterized as disposed over the semiconductor substrate 200. The lower transparent electrode layer 272 includes a plurality of lower transparent electrode layers (which may be characterized as a plurality of first transparent electrode layers) that respectively correspond to the plurality of photoelectric transducers 204 and that are spaced apart from each other. The lower transparent electrode layer 272 may be formed of a transparent conductive material such as, for example, indium tin oxide (ITO), indium zinc oxide (IZO), zinc oxide (ZnO), stannic oxide (SnO$_2$), antimony-doped tin oxide (ATO), aluminum-doped zinc oxide (AZO), gallium-doped zinc oxide (GZO), titanium dioxide (TiO$_2$), or fluorine-doped tin oxide (FTO) among other transparent conductive materials.

In some embodiments, the lower transparent electrode layers 272 may be formed using a damascene method. For example, the lower transparent electrode layers 272 may be formed on the first cover insulating layer 234 by forming a plurality of spaced recesses in the first cover insulating layer 234, forming a lower transparent electrode material to cover the first cover insulating layer 234 and fill the spaced recesses, and removing a part of the lower transparent electrode material to expose a top surface of the first cover insulating layer 234, so that the lower transparent electrode material remains as respectively filling the plurality of recessed spaces to thereby form the lower transparent electrode layers 272. A top surface of the lower transparent electrode layer 272 and an uppermost end of the first cover insulating layer 234 may have the same level. That is, the top surface of the lower transparent electrode layer 272 and a top surface of the first cover insulating layer 234 may form a plane of the same level.

A bottom surface of the lower transparent electrode layer 272 may be located at a higher level than that of a top surface of the first pad 260. Specifically, the top surface of the first pad 260 and the bottom surface of the lower transparent electrode layer 272 may have a level difference of a first height h1 with respect to a main surface of the semiconductor substrate 200. The first pad 260 is located at a lower level than that of the lower transparent electrode layer 272, and thus, irrespective of a presence of the first pad 260, the damascene method of forming the lower transparent electrode layer 272 may be performed.

In some embodiments, a dual damascene method of forming a plurality of holes that penetrate at least a part of the first cover insulating layer 234 toward the semiconductor substrate 200 from each of the plurality of recessed spaces, forming the lower transparent electrode material filling the plurality of holes and the plurality of recessed spaces and covering the first cover insulating layer 234, and removing a part of the lower transparent electrode material to expose the top surface of the first cover insulating layer 234 may be performed. By using the dual damascene method, the lower transparent electrode layer 272 and at least a part of the second via plug 252 may be integrally formed. In this case, as described above, at least the part of the second via plug 252 may be formed of a transparent conductive material. When the second via plug 252 includes a part formed of a metallic material and another part formed of a transparent conductive material disposed on the part formed of the metallic material, the part formed of the metallic material of the second via plug 252 may be exposed through bottom surfaces of the holes during a process of forming the recessed spaces and the holes.

An organic photoelectric layer 274 is formed on the lower transparent electrode layer 272 in the active pixel region APR and the black pixel region BPR. The organic photoelectric layer 274 may be integrally formed on the plurality of lower transparent electrode layers 272. The organic photoelectric layer 274 may be formed across a plane at the same level formed by a top surface of the lower transparent electrode layers 272 and a top surface of the first cover insulating layer 234. In some embodiments, the organic photoelectric layer 274 may be formed of an organic material which causes a photoelectric change only in light with a particular wavelength. For example, the organic photoelectric layer 274 may cause the photoelectric change only at a wavelength of green light. For example, the organic photoelectric layer 274 may show a maximum absorption wavelength λmax from about 500 nm to about 600 nm in both of first and second pixel regions P1 and P2.

The organic photoelectric layer 274, in which a P-type semiconductor material and an N-type semiconductor material form a PN flat junction or a bulk heterojunction, may include a single layer or multiple layers, and is a layer which receives incident light, generates an exciton, and then separates the generated exciton into a positive hole and an electron. The P-type semiconductor material and the N-type semiconductor material may each absorb light of a green wavelength region and may each show a maximum absorption peak in a wavelength region of from about 500 nm to about 600 nm. The P-type semiconductor material and the N-type semiconductor material may each have, for example, a bandgap within the range of about 1.5 eV to about 3.5 eV and, within this range, may each have a bandgap within the range of about 2.0 eV to about 2.5 eV. The P-type semiconductor material and the N-type semiconductor material may absorb the light of the green wavelength region by having the bandgap within that range and particularly may each show the maximum absorption peak in a wavelength region of from about 500 nm to about 600 nm.

The organic photoelectric layer 274 may be a single layer or may be multiple layers. The organic photoelectric layer 274 may have, for example, various combinations such as an intrinsic layer (I-layer), a P-type layer/I-layer, an I-layer/N-type layer, a P-type layer/I-layer/N-type layer, a P-type layer/N-type layer, among other combinations. The I-layer may include the P-type semiconductor compound and the N-type semiconductor compound mixed at a ratio of from about 1:100 to about 100:1. Within this range, the ratio may be from about 1:50 to about 50:1. Within this range, the ratio may be from about 1:10 to about 10:1. Within this range, the ratio may be about 1:1. As a P-type semiconductor and an N-type semiconductor have a composition ratio within that ratio, an exciton may be effectively generated and a PN-junction may be formed. A P-type layer may include the P-type semiconductor compound, and an N-type layer may include the N-type semiconductor compound.

The organic photoelectric layer 274 may have, for example, a thickness from about 1 nm to about 500 nm. In some embodiments, the organic photoelectric layer 274 may have a thickness from about 5 nm to about 300 nm. The organic photoelectric layer 274 may have a thickness capable of effectively improving photoelectric conversion efficiency by effectively absorbing light and effectively separating and transferring positive holes and electrons. Ends of the organic photoelectric layer 274 and the first pad 260 that face each other may be spaced apart from each other by a first distance d1. The first distance d1 may be, for example, from about 10 μm to about 700 μm.

An upper transparent electrode layer 276, which may be characterized as a second transparent electrode layer, is formed on the organic photoelectric layer 274. The upper transparent electrode layer 276 may be formed of, for example, indium tin oxide (ITO), indium zinc oxide (IZO), zinc oxide (ZnO), stannic oxide ($SnO_2$), antimony-doped tin oxide (ATO), aluminum-doped zinc oxide (AZO), gallium-doped zinc oxide (GZO), titanium dioxide ($TiO_2$), or fluorine-doped tin oxide (FTO) among other transparent material. The upper transparent electrode layer 276 may be integrally formed across the active pixel region APR and the black pixel region BPR. That is, the upper transparent electrode layer 276 may be integrally formed across the plurality of photoelectric transducers 204. In some embodiments, the upper transparent electrode layer 276 may be formed to cover both top surface and sides of the organic photoelectric layer 274.

The upper transparent electrode layer 276 from the active pixel region APR and the black pixel region BPR may be integrally formed with a part of the power delivery region PDR. Specifically, the upper transparent electrode layer 276 may extend toward the first pad 260 from an end of the organic photoelectric layer 274 by a predetermined distance. The upper transparent electrode layer 276 may extend toward the first pad 260 from the end of the organic photoelectric layer 274 by a distance smaller than the first distance d1. For example, an extension length of an extender 276E of the upper transparent electrode layer 276 that extends toward the first pad 260 from the end of the organic photoelectric layer 274 may be from about 2 μm to about 150 μm.

In the description of the various embodiments, a plurality of transparent electrode layers (for example, the lower transparent electrode layer 272) that are spaced apart from each other to respectively correspond to the plurality of unit pixel regions may be referred to as first transparent electrode layers, and a transparent electrode layer (for example, the upper transparent electrode layer 276) integrally formed with the plurality of unit pixel regions may be referred to as a second transparent electrode layer.

A second cover insulating layer 282 is formed on the first cover insulating layer 234 and the upper transparent electrode layer 276. The second cover insulating layer 282 may be formed of a transparent insulating material. The second cover insulating layer 282 may include, for example, a silicon oxide layer or a metallic oxide layer.

The second cover insulating layer 282 is disposed so as not to cover at least a part of a top surface of the first pad 260. Also, the second cover insulating layer 282 is disposed so as not to cover at least part of the upper transparent electrode layer 276. For example, the second cover insulating layer 282 may not cover a first part 276E1 that is a part of the extender 276E of the upper transparent electrode layer 276 that extends toward the first pad 260 from the end of the organic photoelectric layer 274. A second distance d2 that is an first extension length of the first part 276E1 of the upper transparent electrode layer 276 that is not covered by the second cover insulating layer 282 may have a value greater than that of a third distance d3 that is a second extension length of another part of the extender 276E, i.e., a second part 276E2 that is a part covered by the second cover insulating layer 282. The second part 276E2 is a part between the upper transparent electrode layer 276 disposed in the black pixel region BPR and the first part 276E1. In some embodiments, the extender 276E of the upper transparent electrode layer 276 may not be covered by the second cover insulating layer 282. For example, the second distance d2 may be from about 2 μm to about 150 μm, and the third distance d3 may be from about 0 to about 148 μm.

In this regard, the first distance d1, the second distance d2, and the third distance d3 mean distances in directions from the end of the organic photoelectric layer 274, i.e. an edge of the black pixel region BPR, to the first pad 260.

In some embodiments, a third cover insulating layer 284 may be formed on the second cover insulating layer 282. The third cover insulating layer 284 may cover only a part of a top surface of the second cover insulating layer 282. The third cover insulating layer 284 may be disposed so as not to cover the first part 276E1 of the extender 276E of the upper transparent electrode layer 276 from the first pad 260 and so as to cover the second part 276E2 and the surface of the second cover insulating layer 282 formed in the active pixel region APR and the black pixel region BPR. The third cover insulating layer 284 may be formed of a transparent insulating material. The third cover insulating layer 284 may include, for example, a silicon oxynitride layer. In some embodiments, the third cover insulating layer 284 may be omitted.

In some embodiments, after the first through third cover insulating layers 234, 282, and 284 are formed to wholly cover the first pad 260, at least a part of the first pad 260 may be exposed by removing a part of the first through third cover insulating layers 234, 282, and 284. Likewise, in some embodiments, the first part 276E1 of the extender 276E of the upper transparent electrode layer 276 may be exposed by first forming the second and third cover insulating layers 282 and 284 to wholly cover the top surface of the first cover insulating layer 234 and then removing parts of the second and third cover insulating layers 282 and 284.

A micro lens 286 corresponding to the color filter layer 240 is formed on the third cover insulating layer 284 in the active pixel region APR. In some embodiments, when the third cover insulating layer 284 is omitted, the micro lens 286 may be formed on the second cover insulating layer 282. The micro lens 286 may be formed to overlap with the corresponding color filter layer 240. A plurality of such micro lenses 286 is formed to correspond to the plurality of color filter layers 240. The micro lens 286 may change a path of light incident on regions other than the photoelectric transducers 204, to concentrate the light on the photoelectric transducers 204.

In the power delivery region PDR and the black pixel region BPR, an interconnection layer 290 is in contact with the first pad 260 and the first part 276E1 of the extender 276E of the upper transparent electrode layer 276. The interconnection layer 290 electrically connects the first pad 260 and the first part 276E1. The interconnection layer 290 may have a single layer structure including for example a metallic material such as copper (Cu), aluminum (Al), nitride titanium (TiN), or tungsten (W), or a conductive metal nitride, or may have a multilayer structure including a combination of these.

In some embodiments, the interconnection layer 290 may be wholly in contact with the first part 276E1 of the extender 276E of the upper transparent electrode layer 276 (as will be described later with respect to FIG. 2B). In other embodiments, the interconnection layer 290 may be partially in contact with the first part 276E1 of the extender 276E of the upper transparent electrode layer 276 (as will be described later with respect to FIG. 2B).

The interconnection layer 290 includes a connector 292 connecting the first pad 260 and the first part 276E1, and a cover 294 extending from the connector 292 and covering the black pixel region BPR. In some embodiments, the connector 292 and the cover 294 may be integrally formed.

The connector 292 extends from the first pad 260 to the first part 276E1 of the extender 276E of the upper transparent electrode layer 276. The connector 292 includes a first contactor CT1 in contact with the top surface of the first pad 260, a second contactor CT2 in contact with the first part 276E1 of the extender 276E of the upper transparent electrode layer 276, and a remaining part disposed between the first contactor CT1 and the second contactor CT2 and connecting the first contactor CT1 and the second contactor CT2. In some embodiments, the connector 292 may have a line shape. In other embodiments, a part of the connector 292 excluding the second connector CT2, or a part of the connector 292 excluding the second connector CT2 and a part adjacent to the second connector CT2 may have the line shape.

The cover 294 extends from the connector 292 to cover the third cover insulating layer 284 of the black pixel region BPR. The cover 294 wholly covers the black pixel region BPR. Specifically, the cover 294 may overlap with all the unit pixel regions disposed in the black pixel region BPR in a vertical direction with respect to a main surface of the semiconductor substrate 200. The cover 294 may extend, for example, from an edge of the black pixel region BPR toward the first pad 260 to the active pixel region APR by a fourth distance d4. The fourth distance d4 may be, for example, smaller than 250 μm.

The interconnection layer 290 may be located at the same level as or a higher level than that of the first pad 260 with respect to the main surface of the semiconductor substrate 200. That is, the interconnection layer 290 is not formed at a lower level than that of the top surface of the first pad 260. Thus, the interconnection layer 290 does not pass through an inner portion of the semiconductor substrate 200.

Figure 2A:
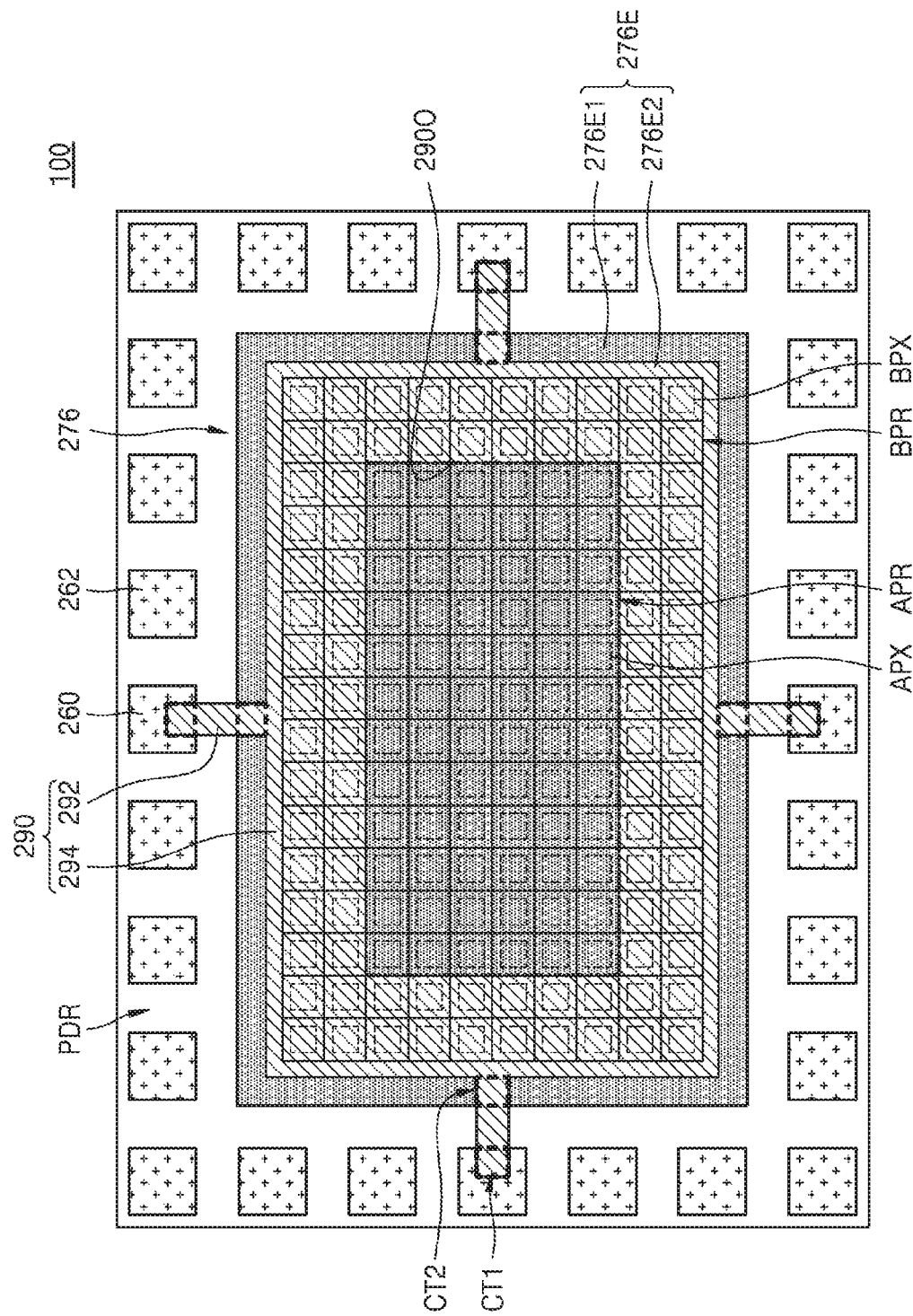
FIG. 2A illustrates a plan layout diagram of a main portion of an image sensor according to an embodiment of the inventive concepts.

FIG. 2A illustrates a plan layout diagram of a main portion of an image sensor 100 according to an embodiment of the inventive concepts. FIG. 2B illustrates a plan layout diagram of a main portion of an image sensor 100a according to an embodiment of the inventive concepts. FIGS. 2A and 2B respectively illustrate plan layout diagrams of the main portion of the image sensor 100 of FIG. 1, and thus repetitive description of structure in FIGS. 2A and 2B previously described with respect to FIG. 1 will be omitted from the following.

Referring to FIG. 2A, the image sensor 100 includes the active pixel region APR, the black pixel region BPR, and the power delivery region PDR. In some embodiments, the black pixel region BPR may be disposed to surround the active pixel region APR. In some embodiments, the power delivery region PDR may be disposed to surround the active pixel region APR and the black pixel region BPR.

In the description of the various embodiments, the power delivery region PDR of the image sensor 100 may mean a part of the image sensor 100 excluding the active pixel region APR and the black pixel region BPR. For example, power pads, circuits for processing a control signal of the image sensor 100 and/or a pixel signal obtained from the image sensor 100, and interconnections for connecting the circuits may be disposed in the power delivery region PDR.

A plurality of active pixels APX and a plurality of black pixels BPX may be respectively disposed in the active pixel region APR and the black pixel region BPR. The active pixels APX and the black pixels BPX may have substantially the same configuration, whereas the active pixels APX may be used to obtain substantial pixel information and the black pixels BPX may be used to measure black current. Although not shown in FIG. 2A, the micro lens 286 of FIG. 1 is disposed in the active pixel region APR, whereas the micro lens 286 is not disposed in the black pixel region BPR. Although not shown in FIG. 2A, the photoelectric transducers 204 of FIG. 1 are disposed in the plurality of active pixels APX and the plurality of black pixels BPX. Although not shown in FIG. 2A, the plurality of lower transparent electrode layers 272 of FIG. 1 are disposed to correspond to the plurality of active pixels APX and the plurality of black pixels BPX.

As shown in FIG. 2A, the upper transparent electrode layer 276 is disposed in the active pixel region APR and the black pixel region BPR. The upper transparent electrode layer 276 may be integrally formed across the plurality of active pixels APX and the plurality of black pixels BPX. The upper transparent electrode layer 276 includes the extender 276E extending from the active pixel region APR and the black pixel region BPR and disposed on a part of the power delivery region PDR. The extender 276E includes the first part 276E1 and the second part 276E2.

As further shown in FIG. 2A, the plurality of pads 260 and 262 are disposed in the power delivery region PDR. The plurality of pads 260 and 262 may be disposed in the power delivery region PDR along perimeters of the active pixel region APR and the black pixel region BPR. The plurality of pads 260 and 262 may include the first pad 260 and the second pads 262. The first pad 260 may be a DC pad to which DC power is delivered from outside. The second pads 262 may be pads to which AC power, DC power, or a control signal is delivered from outside, or may be pads transmitting and receiving a data signal to and from outside. In some embodiments, the second pads 262 may include a DC pad to which DC power is delivered from outside. Specifically, the first pad 260 means a pad, among pads to which DC power is delivered from outside, that is electrically connected to the upper transparent electrode layer 276 and delivering DC power to the upper transparent electrode layer 276.

As further shown in FIG. 2A, the image sensor 100 includes the interconnection layer 290. The interconnection layer 290 includes the connector 292 and the cover 294. The connector 292 means a part of the interconnection layer 290 including the first contactor CT1 that is a part in contact with the first pad 260 to the second contactor CT2 that is a part in contact with the first part 276E1. Thus, the second part 276E2 is not in direct contact with the connector 292. The connector 292 may be electrically connected to the first pad 260 and the first part 276E1. The cover 294 extends from the connector 292 to cover the black pixel region BPR. In some embodiments, the connector 292 and the cover 294 may be integrally formed.

A plurality of connectors 292 may be formed adjacent to edges of the active pixel region APR and the black pixel region BPR, for example at an outer edge of the black pixel region BPR. In some embodiments, when the outer edge of the black pixel region BPR includes four sides, at least respective one of the plurality of connectors 292 may be formed adjacent to each of the four sides included in the outer edge of the black pixel region BPR. That is, at least one of the plurality of connectors 292 may be formed adjacent to each of parts of the upper transparent electrode layer 276 adjacent to four sides included in an edge of the upper transparent electrode layer 276. In this case, a plurality of first pads 260 may be formed to correspond to the plurality of connectors 292 so that at least one of the plurality of first pads 260 corresponds to each of four outer edges of the black pixel region BPR.

In some embodiments, a part of the first part 276E1 of the extender 276E of the upper transparent electrode layer 276 of FIG. 2A that is not covered by the connector 292 may not be formed.

The cover 294 is disposed on the black pixel region BPR. The cover 294 may cover all the black pixels BPX disposed in the black pixel region BPR. As also shown in FIG. 2A, the cover 294 includes an open space 290O therein. The open space 290O of the cover 294 may be located to correspond to the active pixel region APR. That is, the plurality of active pixels APX may be disposed in a lower side of the open space 290O. Thus, the cover 294 may have a ring shape continuously extending to surround the active pixel region APR and covering the black pixels BPX.

Referring to FIG. 2B, the image sensor 100a includes an interconnection layer 290a that is different than the interconnection layer 290 shown in FIG. 2A. The interconnection layer 290a includes a connector 292a and a cover 294a. The connector 292a means a part of the interconnection layer 290a including the first contactor CT1 that is a part in contact with the first pad 260 to a second contactor CT2a that is a part in contact with the first part 276E1. Unlike the connector 292 of the interconnection layer 290 of the image sensor 100 of FIG. 2A, the connector 292a of the interconnection layer 290a of the image sensor 100a of FIG. 2B has a ring shape in which the second contactor CT2a continuously extends to surround the second part 276E2 and is in contact with the first part 276E1. Thus, the second contactor CT2a of the connector 292a surrounds the cover 294a. A part of the connector 292a excluding the second connector CT2a or a part adjacent to the second connector CT2a, i.e., the first contactor CT1 and at least a part of a portion connecting the first contactor CT1 and the second contactor CT2a, may have a line shape.

The second contactor CT2a continuously extends to surround the second part 276E2 and is in contact with the first part 276E1, and thus DC power may be uniformly delivered to the upper transparent electrode layer 276 as a whole.

Referring to FIGS. 1 through 2B, the image sensors 100 and 100a may directly connect the first pad 260 and the upper transparent electrode layer 276 via the connectors 292 and 292a of the interconnection layers 290 and 290a. Thus, DC power delivered from outside to the first pad 260 may be directly delivered to the upper transparent electrode layer 276 without using wires or components in the semiconductor substrate 200.

When DC power is delivered to an upper transparent electrode layer from a first pad via (or through) a semiconductor substrate, a power circuit region for applying power to the semiconductor substrate must be additionally formed, and thus an area of an image sensor increases.

In contrast, the image sensors 100 and 100a according to embodiments of the inventive concepts directly connect the first pad 260 and the upper transparent electrode layer 276 respectively via the connectors 292 and 292a of the interconnection layers 290 and 290a, so that a power circuit region is not needed, thereby reducing area of the image sensors 100 and 100a.

Also, the connectors 292 and 292a are formed of the same material as the covers 294 and 294a, so that an additional process for forming the connectors 292 and 292a is not required. Also, DC power is delivered to the covers 294 and 294a via the connectors 292 and 292a, which prevents the covers 294 and 294a from electrically floating, thereby increasing reliability of the image sensors 100 and 100a.

Figure 3:
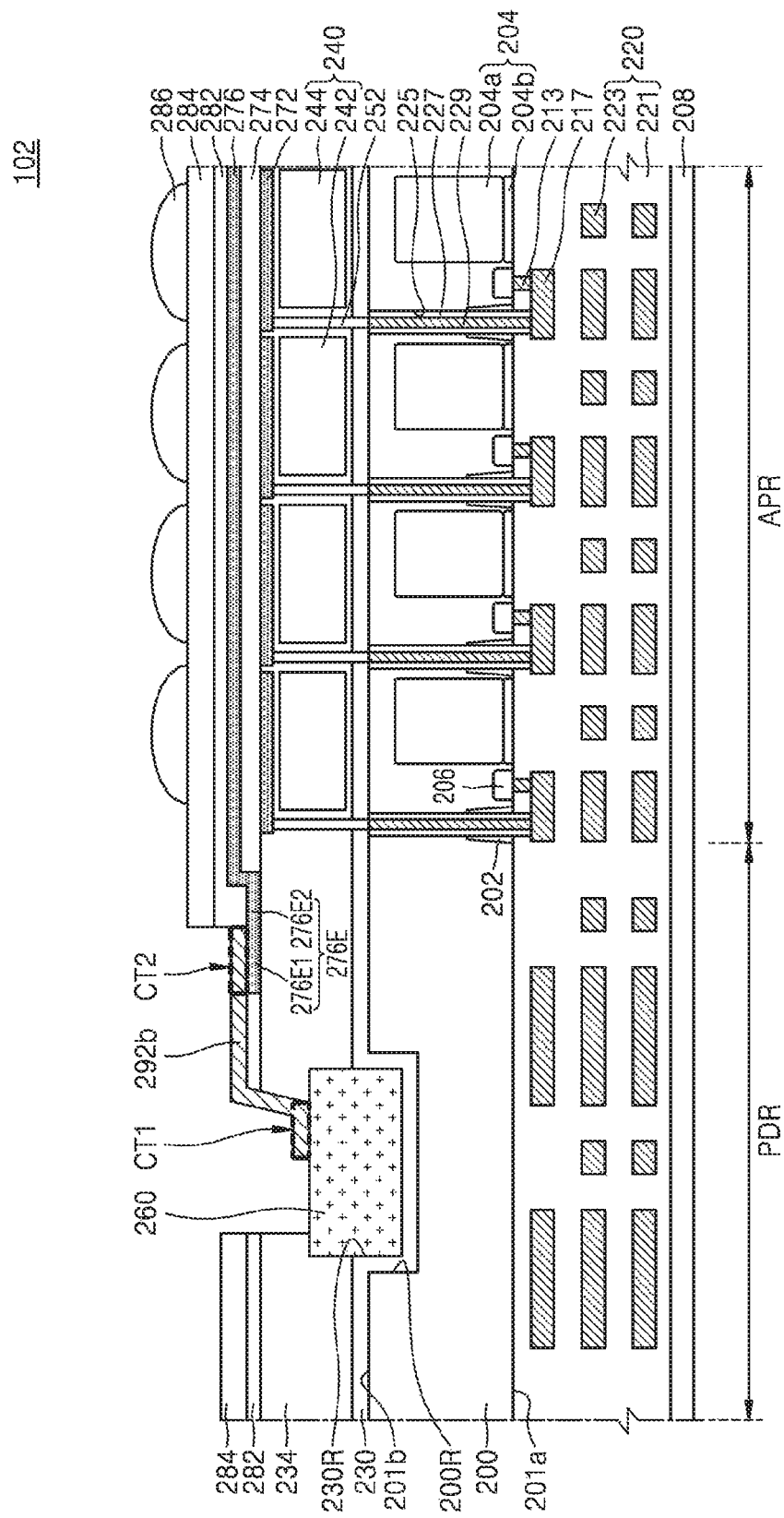
FIG. 3 illustrates a cross-sectional view of a main portion of an image sensor according to another embodiment of the inventive concepts.
Figure 4:
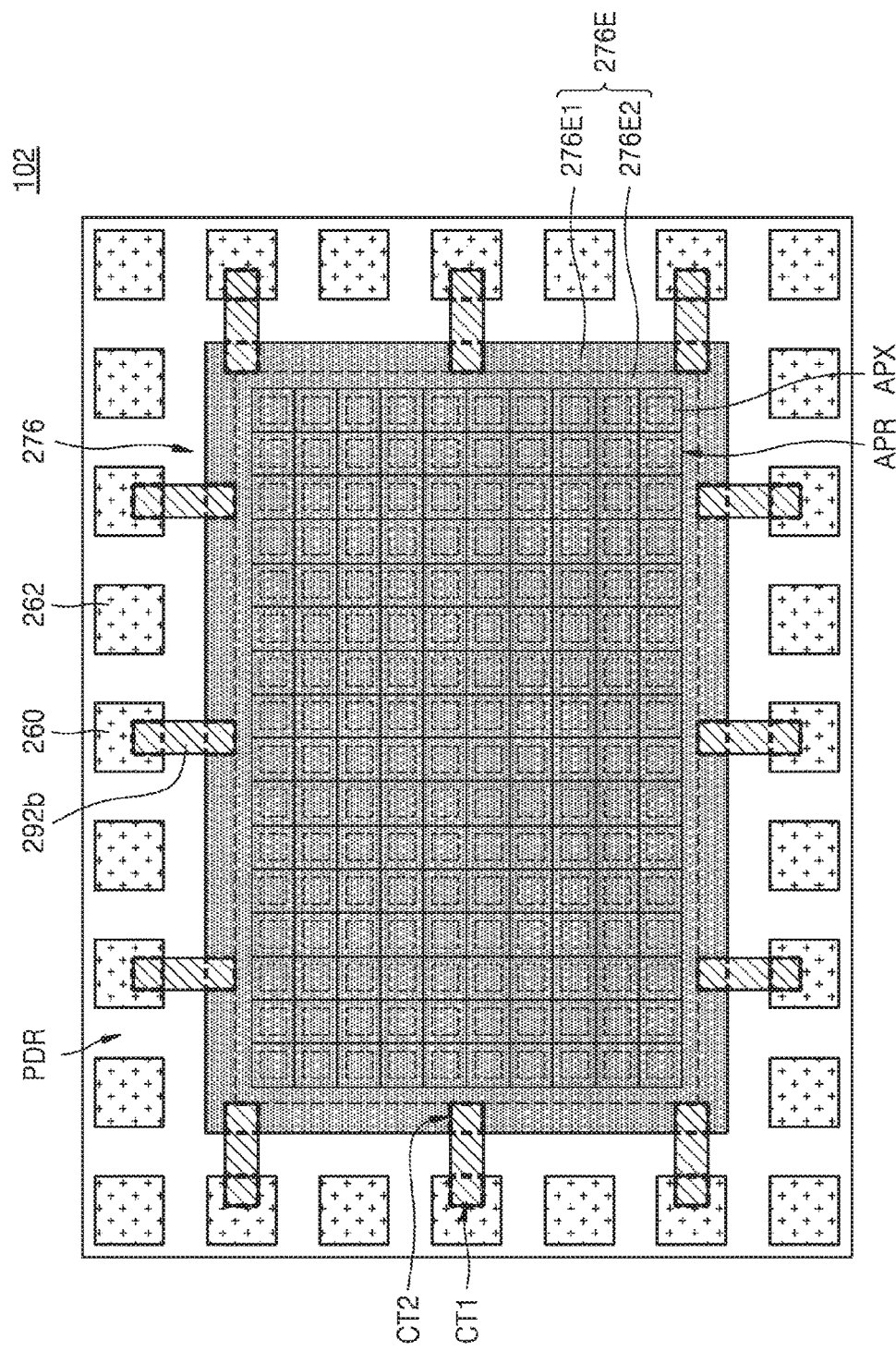
FIG. 4 illustrates a plan layout diagram of a main portion of an image sensor according to another embodiment of the inventive concepts.

FIG. 3 illustrates a cross-sectional view of a main portion of an image sensor 102 according to another embodiment of the inventive concept. FIG. 4 illustrates a plan layout diagram of a main portion of the image sensor 102 according to another embodiment of the inventive concept. Much of the structure in FIGS. 3 and 4 is similar to the structure in FIGS. 1 through 2B, and thus repetitive description of structure in FIGS. 3 and 4 previously described with respect to FIGS. 1 through 2B will be omitted from the following.

Referring to FIG. 3, the image sensor 102 includes the semiconductor substrate 200 including the active pixel region APR and power delivery region PDR. A black pixel region such as black pixel region BPR in FIGS. 1-2B is not included in the image sensor 102 of FIGS. 3 and 4. Since a black pixel region is not included, image sensor 102 includes an interconnection layer 292b in place of interconnection layers 290 and 290a.

Unlike the interconnection layer 290 of FIG. 1 for example, the interconnection layer 292b of the image sensor 102 of FIG. 3 does not include the cover 294. That is, the interconnection layer 292b of the image sensor 102 of FIG. 3 corresponds to the interconnection layer 290 of FIG. 1.

In the embodiment of FIGS. 3 and 4, the image sensor 102 does not include the black pixel region BPR of FIG. 1. In some embodiments, the image sensor 102 may include a region corresponding to the black pixel region BPR of FIG. 1 in a region spaced apart from the active pixel region APR.

Thus, the interconnection layer 292b may extend from the first pad 260 only to the first part 276E1 of the extender 276E of the upper transparent electrode layer 276.

Although not shown, in some embodiments, the second contactor CT2 of the interconnection layer 292b may have a ring shape extending to surround the active pixel region APR like the second contactor CT2a of FIG. 2B.

Figure 5A:
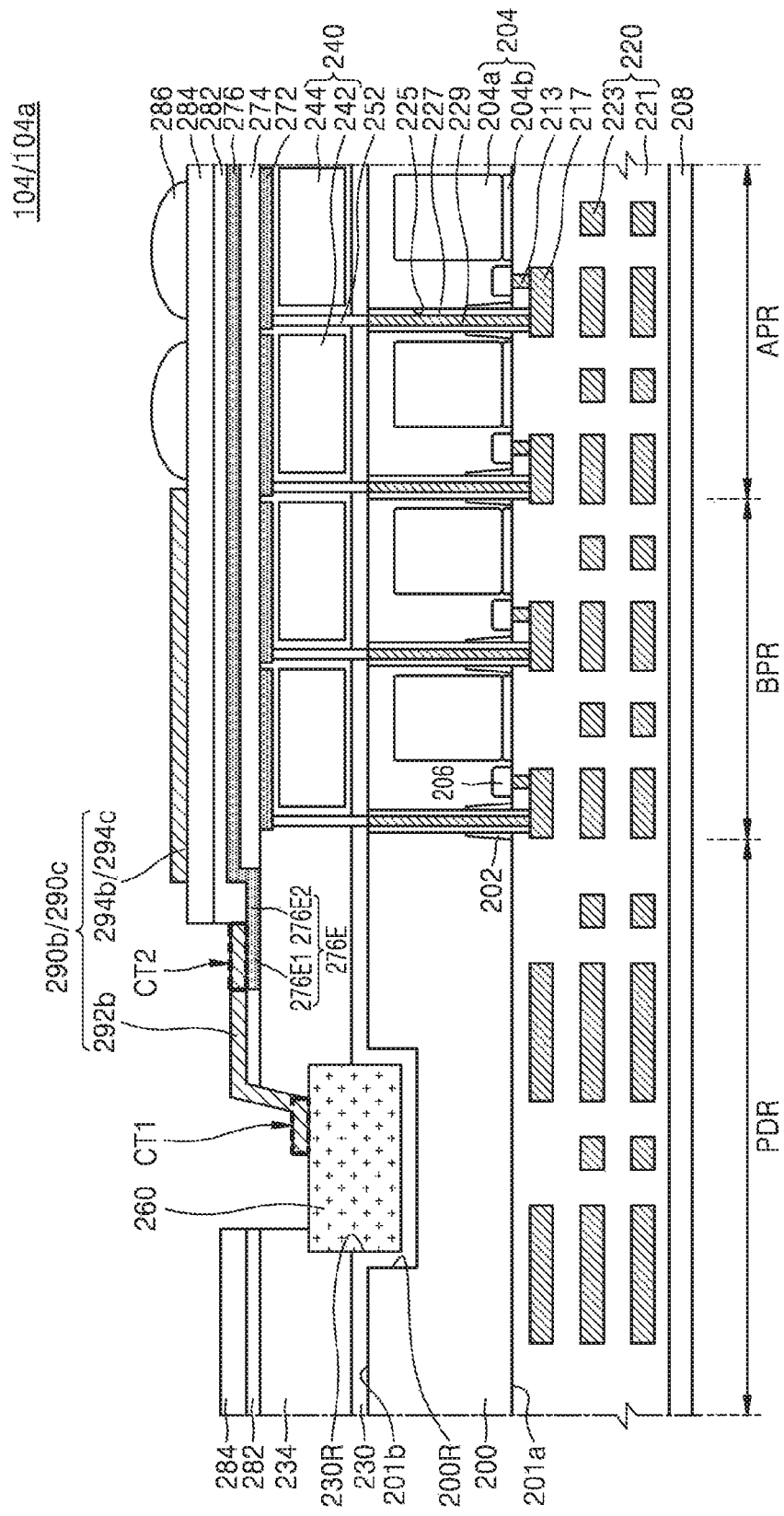
FIG. 5A illustrates a cross-sectional view of a main portion of an image sensor according to another embodiment of the inventive concepts.
Figure 5B:
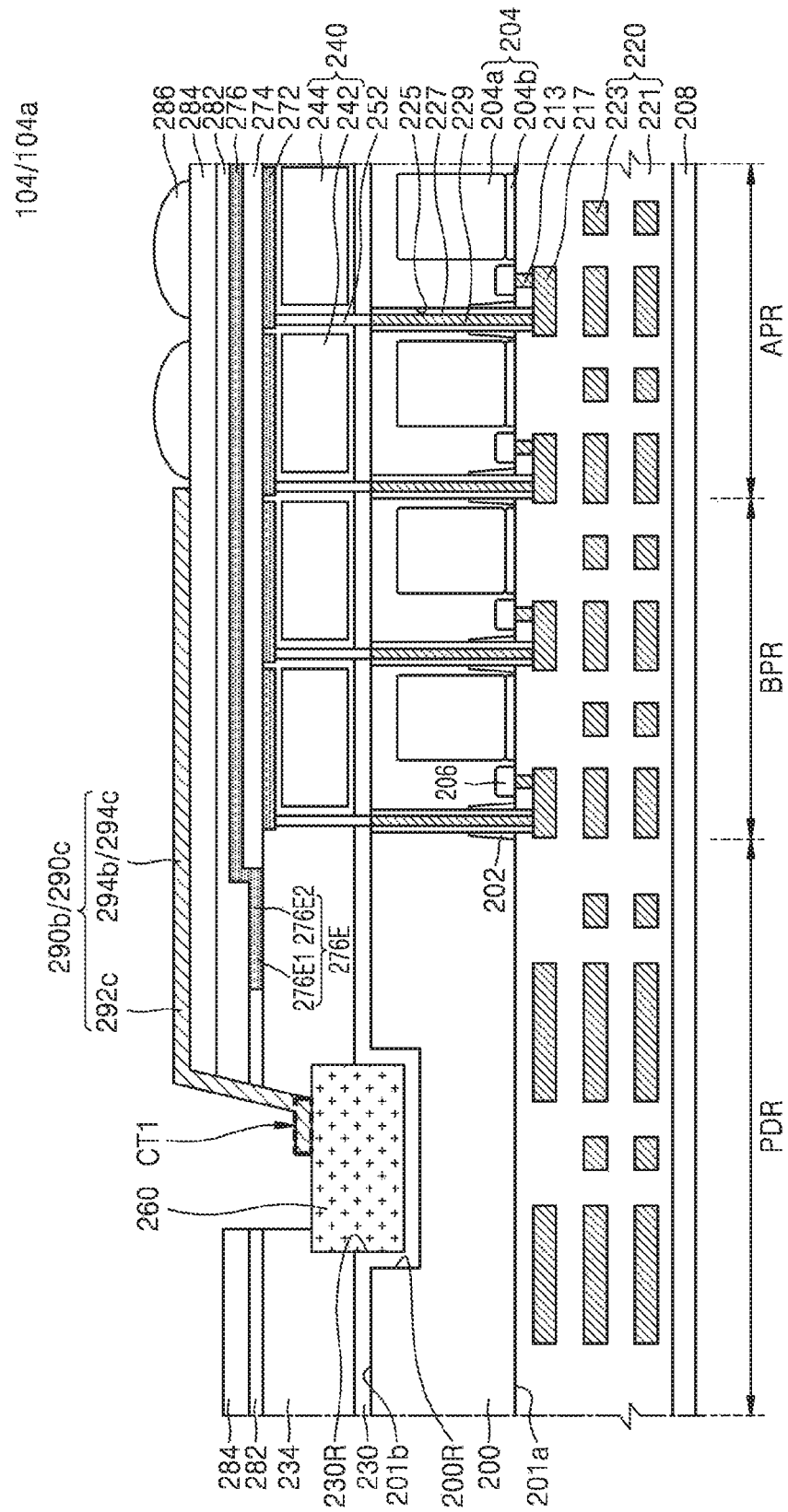
FIG. 5B illustrates a cross-sectional view of a main portion of an image sensor according to another embodiment of the inventive concepts.
Figure 6A:
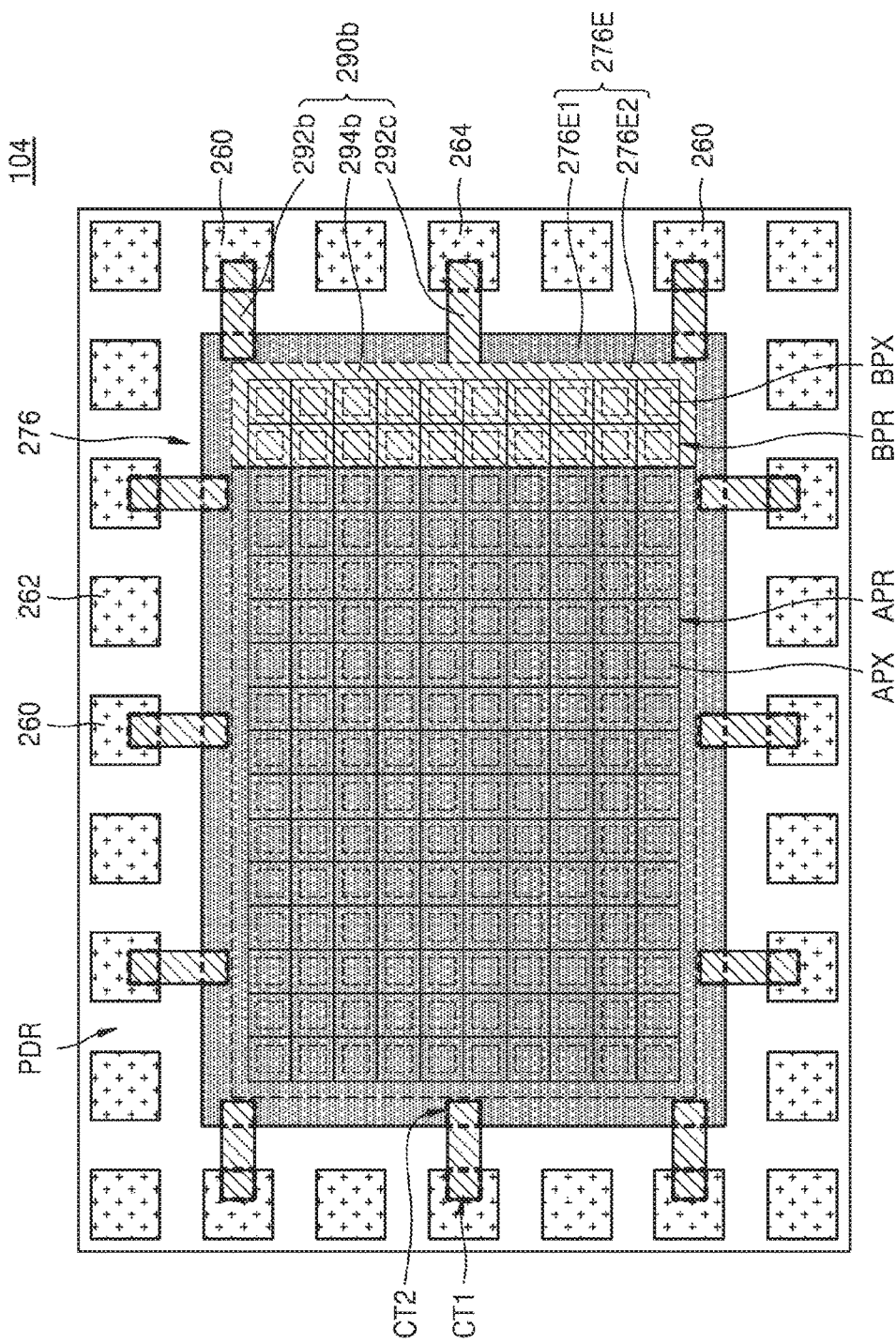
FIG. 6A illustrates a plan layout diagram of a main portion of an image sensor according to another embodiment of the inventive concepts.

FIG. 5A illustrates a cross-sectional view of a main portion of an image sensor according to another embodiment of the inventive concepts. FIG. 5B illustrates a cross-sectional view of a main portion of an image sensor according to another embodiment of the inventive concepts. FIG. 6A illustrates a plan layout diagram of a main portion of an image sensor according to another embodiment of the inventive concepts. FIG. 6B illustrates a plan layout diagram of a main portion of an image sensor according to another embodiment of the inventive concepts. Much of the structure in FIGS. 5A through 6B is similar to the structure in FIGS. 1 through 4, and thus repetitive description of structure in FIGS. 5A through 6B previously described with respect to FIGS. 1 through 4 will be omitted from the following. Among reference numerals 104/104a, 290b/290c, and 294b/294c of FIGS. 5A and 5B, reference numerals 104, 290b, and 294b are applied to the embodiment of FIG. 6A, and reference numerals 104a, 290c, and 294c are applied to the embodiment of FIG. 6B.

Referring to FIGS. 5A through 6A, the image sensor 104 includes the semiconductor substrate 200 including the active pixel region APR, the black pixel region BPR, and the power delivery region PDR and the interconnection layer 290b. The black pixel region BPR is disposed at least at one side of the active pixel region APR. That is, unlike the image sensors 100 and 100a of FIGS. 1 through 2B in which the black pixel region BPR is disposed to surround all sides of the active pixel region APR, the black pixel region BPR of the image sensor 104 is disposed at one side of the active pixel region APR and does not surround all sides of the active pixel region APR.

The image sensor 104 as shown in FIG. 6A includes the first pad 260, the second pad 262, and the third pad 264. The first pad 260 and the third pad 264 may be DC pads to which DC power is delivered from outside. In some embodiments, DC power of the same voltage may be delivered to the first pad 260 and the third pad 264. In some embodiments, DC power of different voltages may be delivered to the first pad 260 and the third pad 264. In some embodiments, ground may be delivered to one of the first pad 260 and the third pad 264. Although the image sensor 104 shown in FIG. 6A may include a plurality of pads including first pads 260, second pads 262, and third pads 264 among other pads, to simplify description and the drawings only certain pads are described as denoted by reference numerals.

The interconnection layer 290b as shown in FIG. 6A includes the first connector 292b such as shown in FIG. 5A, a second connector 292c such as shown in FIG. 5B, and the cover 294b such as shown in FIGS. 5A and 5B. A cross sectional view of the image sensor 104 taken along an extension direction of the first connector 292b in FIG. 6A is similar to the cross sectional view as shown in FIG. 5A. A cross sectional view of the image sensor 104 taken along the second connector 292c in FIG. 6A is similar to the cross sectional view as shown in FIG. 5B.

The first connector 292b as shown in FIG. 6A extends from the first pad 260 only to the first part 276E1 of the extender 276E of the upper transparent electrode layer 276 to electrically connect the first pad 260 and the first part 276E1. The first connector 292b and the cover 294b are spaced apart from each other. The second connector 292c as shown in FIG. 6A extends from the third pad 264 to the cover 294b to electrically connect the third pad 264 and the cover 294b. In some embodiments, the second connector 292c and the cover 294b may be integrally formed.

The cover 294b covers the black pixel region BPR. The black pixel region BPR is disposed at least at one side of the active pixel region APR, and thus the cover 294b is also disposed at least at one side of the active pixel region APR and does not surround all sides of the active pixel region APR.

The first connector 292b, the second connector 292c, and the cover 294b may be formed of the same material at the same time.

Referring to FIGS. 5A, 5B, and 6B, the image sensor 104a includes the semiconductor substrate 200 including the active pixel region APR, the black pixel region BPR, and the power delivery region PDR and the interconnection layer 290c. The black pixel region BPR is disposed to surround all sides of the active pixel region APR.

The image sensor 104a as shown in FIG. 6B includes the first pad 260, the second pad 262, and the third pad 264. Although the image sensor 104a shown in FIG. 6B may include a plurality of pads including first pads 260, second pads 262, and third pads 264 among other pads, to simplify description and the drawings only certain pads are described as denoted by reference numerals. The interconnection layer 290c includes the first connector 292b such as shown in FIG. 5A, the second connector 292c such as shown in FIG. 5B, and the cover 294c such as shown in FIGS. 5A and 5B. A cross sectional view of the image sensor 104a taken along an extension direction of the first connector 292b in FIG. 6B is similar to the cross sectional view as shown in FIG. 5A. A cross sectional view of the image sensor 104a taken along the second connector 292c in FIG. 6B is similar to the cross sectional view as shown in FIG. 5B.

The first connector 292b as shown in FIG. 6B extends from the first pad 260 only to the first part 276E1 of the extender 276E of the upper transparent electrode layer 276 to electrically connect the first pad 260 and the first part 276E1. The first connector 292b and the cover 294c are spaced apart from each other. The second connector 292c as shown in FIG. 6B extends from the third pad 264 to the cover 294c to electrically connect the third pad 264 and the cover 294c. In some embodiments, the second connector 292c and the cover 294c may be integrally formed. The cover 294c covers the black pixel region BPR. The cover 294c may have a ring shape that continuously extends to surround the active pixel region APR and covers the black pixel BPX.

The first connector 292b, the second connector 292c, and the cover 294c may be formed of the same material at the same time.

Referring to FIGS. 5A through 6B, the interconnection layers 290b and 290c of the image sensors 104 and 104a separately include the first connector 292b electrically connecting the first pad 260 and the upper transparent electrode layer 276, and the second connector 292c electrically connecting the third pad 264 and the covers 294b and 294c, respectively. Thus, DC power of different electric potentials may be delivered to the covers 294b and 294c of the upper transparent electrode layer 276. For example, positive DC power may be delivered to the upper transparent electrode layer 276, and ground may be delivered to the covers 294b and 294c.

Figure 7A:
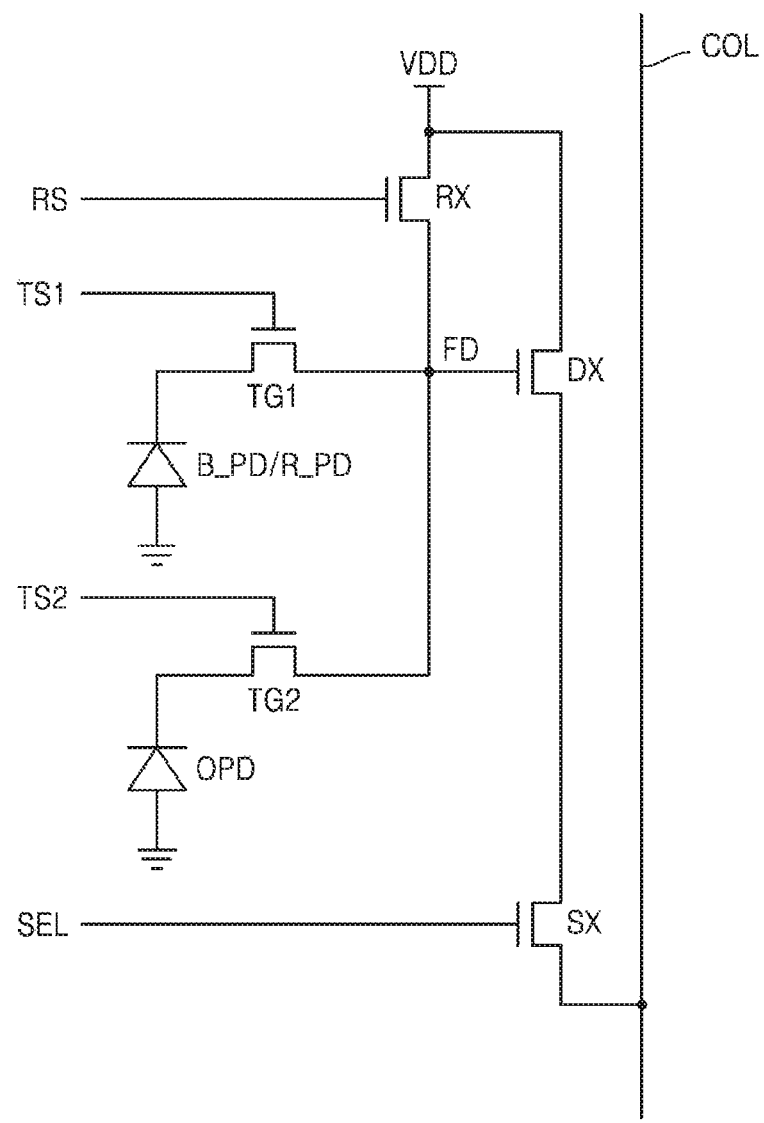
FIG. 7A illustrates a readout circuit diagram of an image sensor according to an embodiment of the inventive concepts.
Figure 7B:
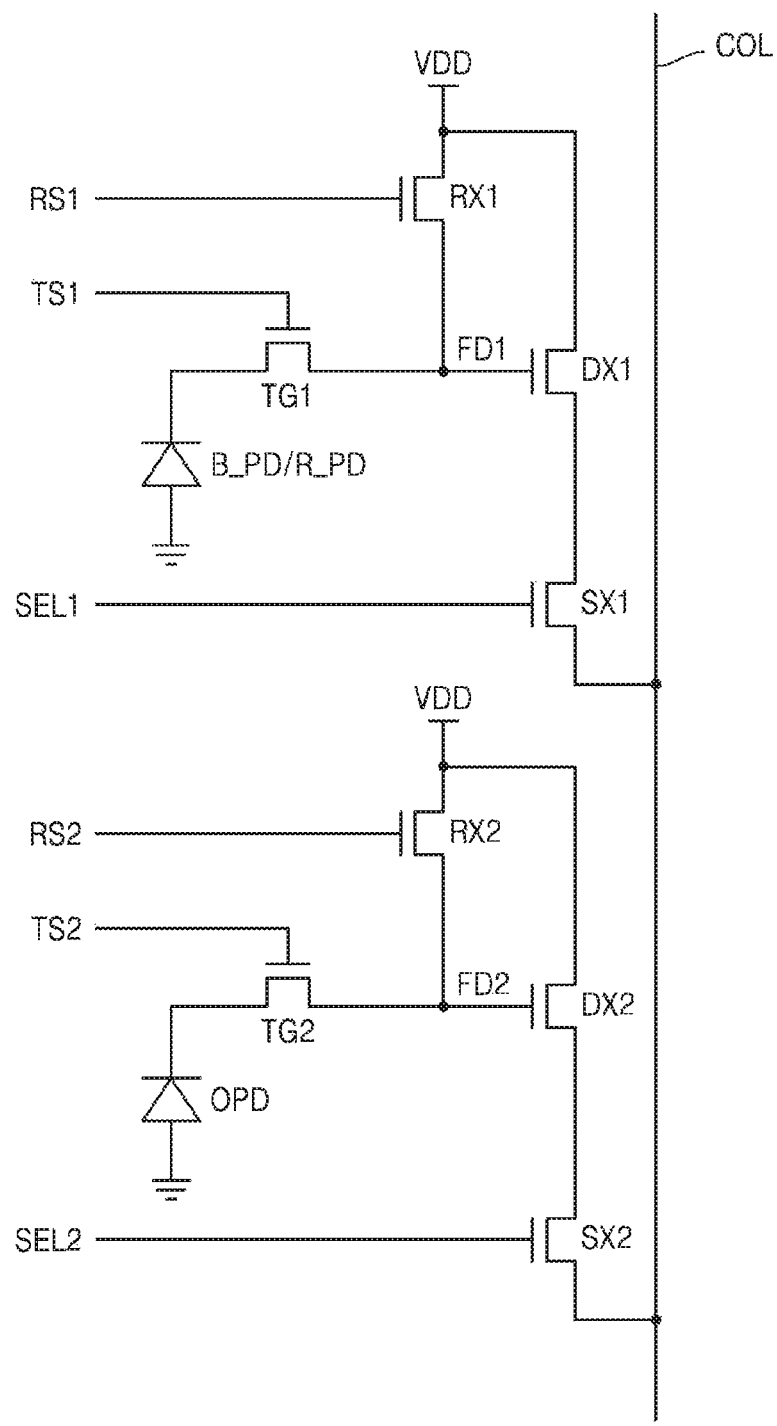
FIG. 7B illustrates a readout circuit diagram of an image sensor according to an embodiment of the inventive concepts.

FIG. 7A illustrates a readout circuit diagram of an image sensor according to an embodiment of the inventive concepts. FIG. 7B illustrates a readout circuit diagram of an image sensor according to an embodiment of the inventive concepts.

Referring to FIG. 7A, OPD, R_PD, or B_PD may for example be embodied as a photo transistor, a photo gate, a pinned photo diode (PPD), or a combination thereof. For example, OPD may be configured by the organic photoelectric layer 274 of FIGS. 1 through 6B. For example, B_PD or R_PD may be configured by the photoelectric transducer 204 of FIGS. 1 through 6B. For example, B_PD may be configured by the photoelectric transducer 204 corresponding to the first color filter layer 242 of FIGS. 1 through 6B. For example, R_PD may be configured by the photoelectric transducer 204 corresponding to the second color filter layer 244 of FIGS. 1 through 6B.

Referring to FIG. 7A, OPD and R_PD share a single floating diffusion region FD. Also, in another example, OPD and B_PD share the single floating diffusion region FD. The floating diffusion region FD may be referred to as a floating diffusion node. When viewed from a pixel, a green pixel and a red pixel share the single floating diffusion region FD. Also, the green pixel and a blue pixel share the single floating diffusion region FD.

The readout circuit as shown in FIG. 7A includes two transmission transistors including first transmission transistor TG1 and second transmission transistor TG2, the floating diffusion region FD, a reset transistor RX, a drive transistor DX, and a selection transistor SX.

The first transmission transistor TG1 operates in response to a first transmission control signal TS1. A second transmission transistor TG2 operates in response to a second transmission control signal TS2. The reset transistor RX operates in response to a reset control signal RS. The selection transistor SX operates in response to a selection signal SEL.

When an activation time of the first transmission control signal TS1 and an activation time of the second transmission control signal TS2 are appropriately controlled, a signal corresponding to electric charges generated by OPD and a signal corresponding to electric charges generated by R_PD may be transmitted to a column line COL according to operations of the respective transistors DX and SX.

Referring to FIG. 7B, a first readout circuit which reads out electric charges generated by R_PD, and a second readout circuit which reads out electric charges generated by OPD, are mutually separated. When viewed from a pixel, a green pixel and a red pixel are mutually separated.

The first readout circuit includes the first transmission transistor TG1, a first floating diffusion region FD1, a first reset transistor RX1, a first drive transistor DX1, and a first selection transistor SX1.

The first transmission transistor TG1 operates in response to a first transmission control signal TS1. The first reset transistor RX1 operates in response to a first reset control signal RS1. The first selection transistor SX1 operates in response to a first selection signal SEL1.

The second readout circuit includes the second transmission transistor TG2, a second floating diffusion region FD2, a second reset transistor RX2, a second drive transistor DX2, and a second selection transistor SX2.

The second transmission transistor TG2 operates in response to a second transmission control signal TS2. The second reset transistor RX2 operates in response to a second reset control signal RS2. The second selection transistor SX2 operates in response to a second selection signal SEL2.

When an activation time of the first transmission control signal TS1 and an activation time of the second transmission control signal TS2 are appropriately controlled, a signal corresponding to electric charges generated by B_PD or R_PD, and a signal corresponding to electric charges generated by OPD may be transmitted to a column line COL according to operations of the respective transistors DX1, SX1, DX2, and SX2.

Figure 8:
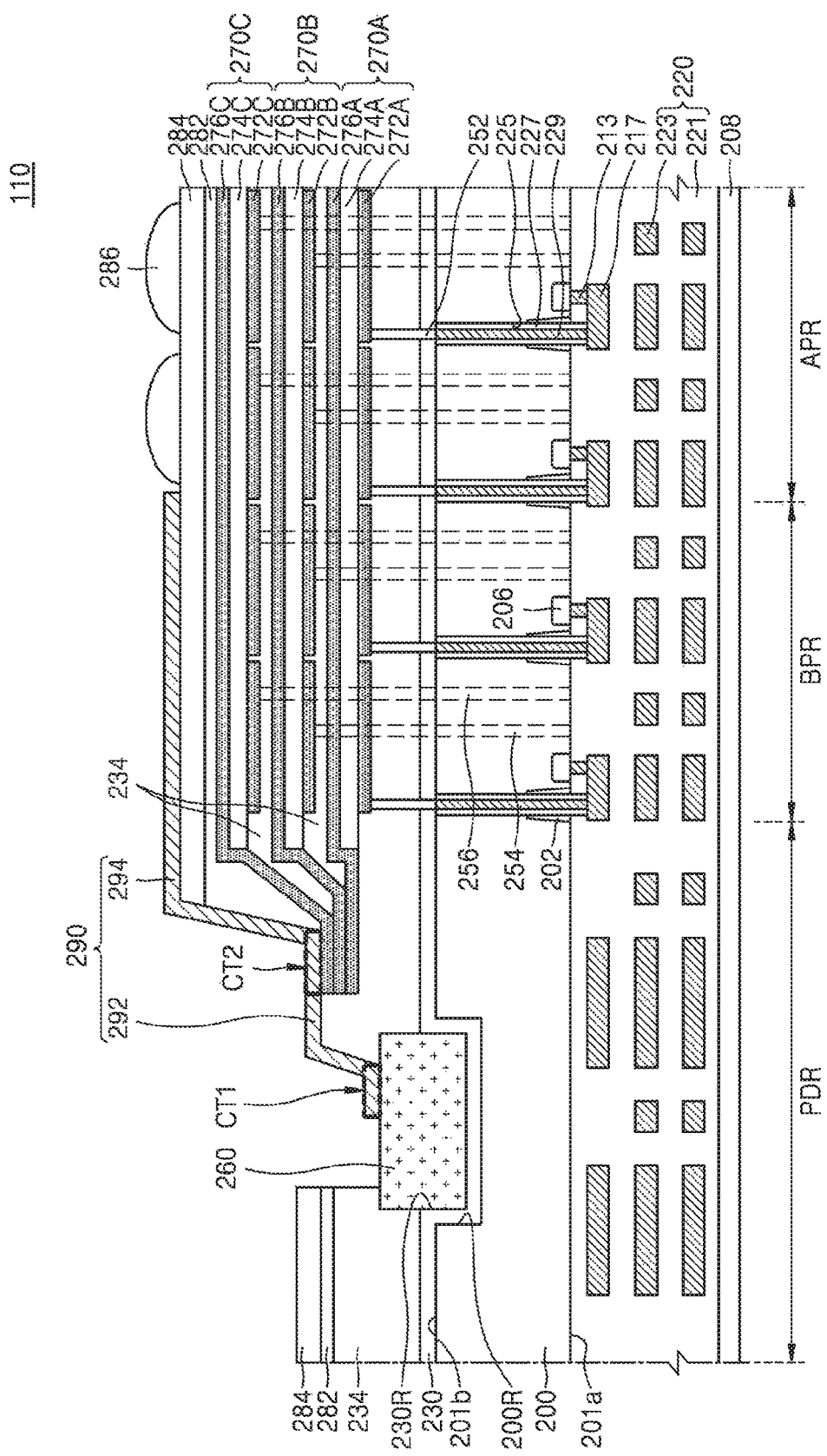
FIG. 8 illustrates a cross-sectional view of a main portion of an image sensor according to another embodiment of the inventive concepts.
Figure 9:
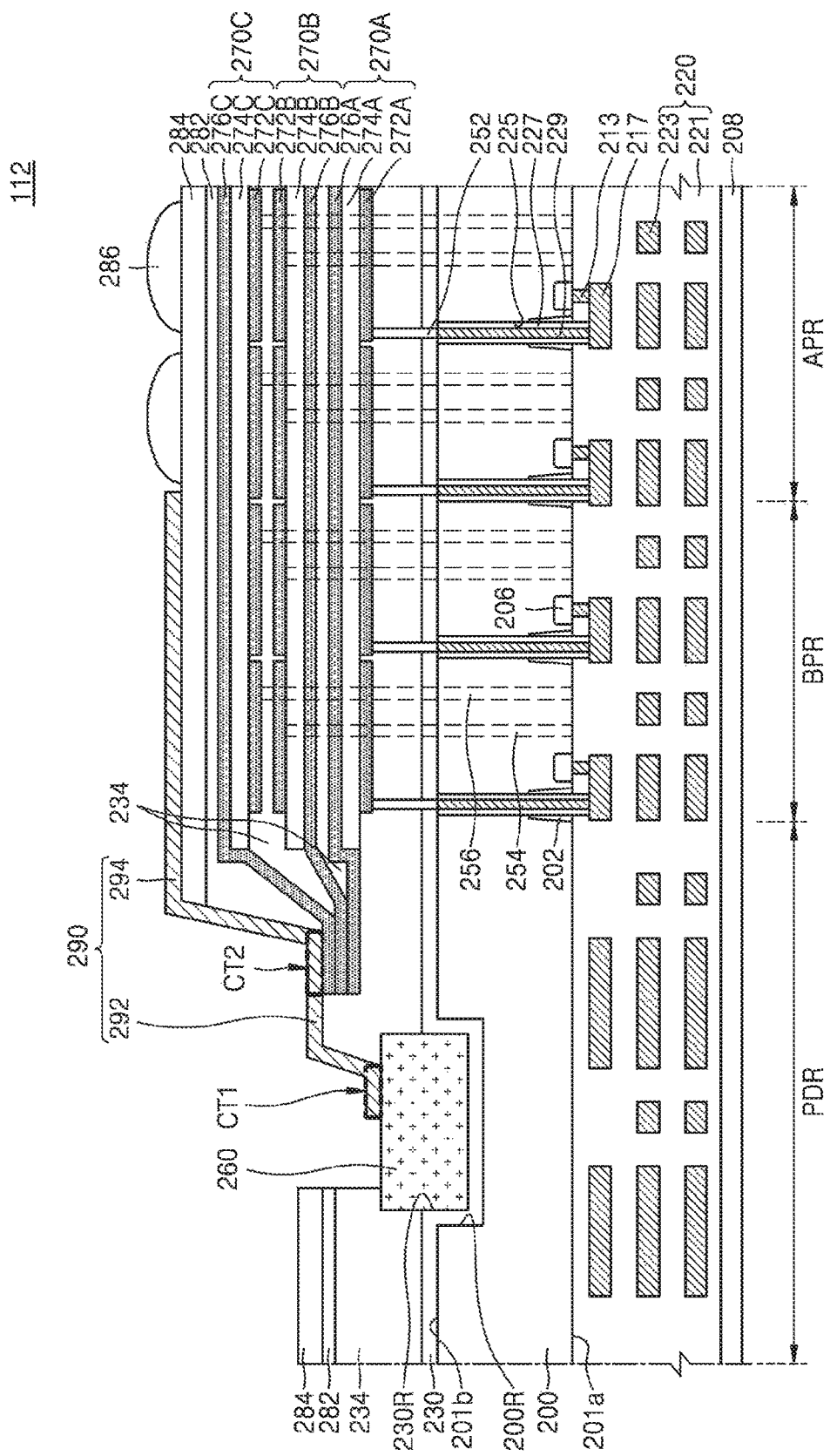
FIG. 9 illustrates a cross-sectional view of a main portion of an image sensor according to another embodiment of the inventive concepts.
Figure 10:
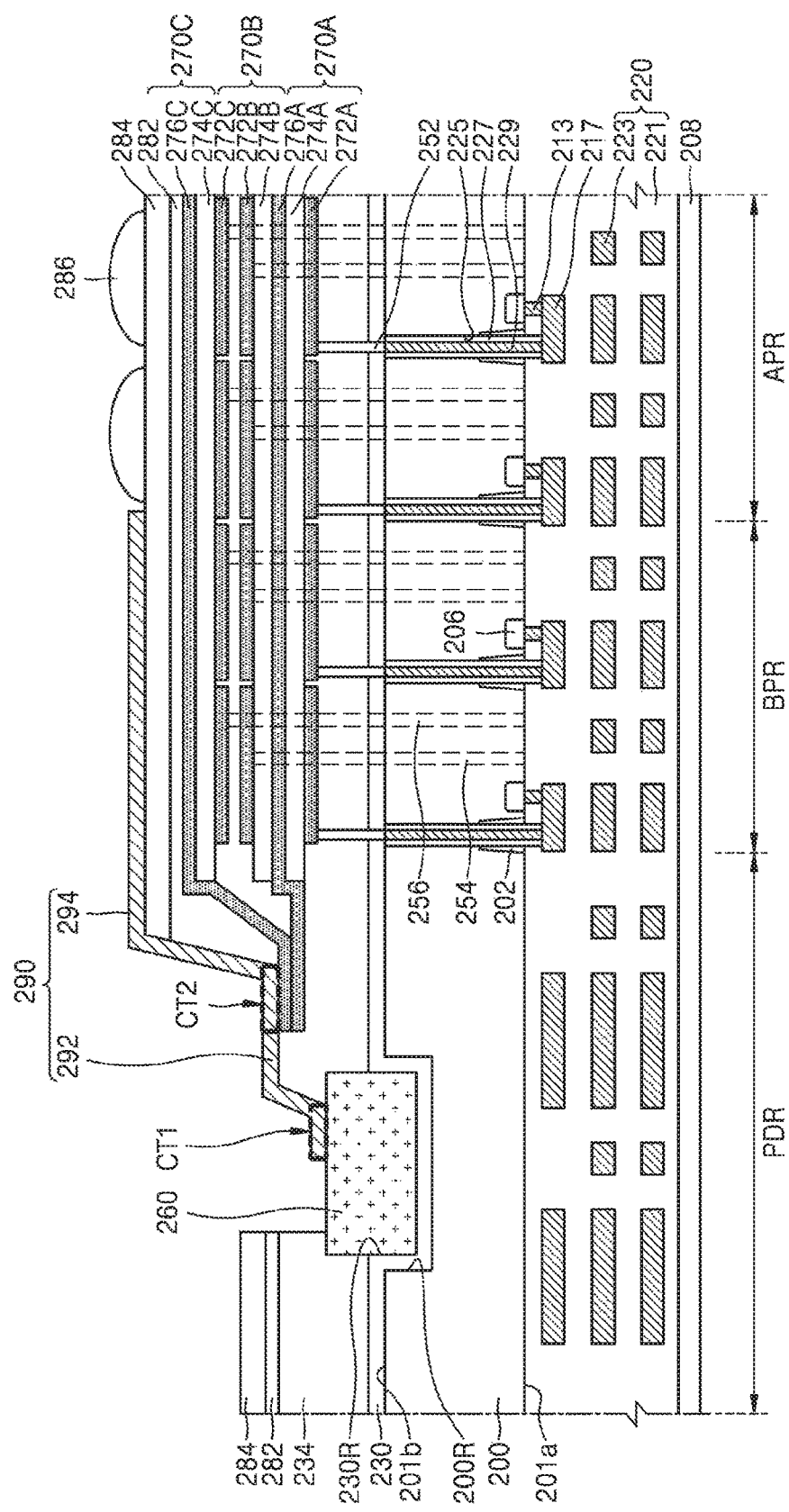
FIG. 10 illustrates a cross-sectional view of a main portion of an image sensor according to another embodiment of the inventive concepts.

FIG. 8 illustrates a cross-sectional view of a main portion of an image sensor according to another embodiment of the inventive concepts. FIG. 9 illustrates a cross-sectional view of a main portion of an image sensor according to another embodiment of the inventive concepts. FIG. 10 illustrates a cross-sectional view of a main portion of an image sensor according to another embodiment of the inventive concepts. Much of the structure in FIGS. 8 through 10 is similar to the structure in FIGS. 1 through 6B, and thus repetitive description of structure in FIGS. 8 through 10 previously described with respect to FIGS. 1 through 6B will be omitted from the following.

Referring to FIG. 8, the image sensor 110 includes a first photolayer 270A including a first lower transparent electrode layer 272A, a first upper transparent electrode layer 276A, and a first organic photoelectric layer 274A disposed between the first lower transparent electrode layer 272A and the first upper transparent electrode layer 276A; a second photolayer 270B including a second lower transparent electrode layer 272B, a second upper transparent electrode layer 276B, and a second organic photoelectric layer 274B disposed between the second lower transparent electrode layer 272B and the second upper transparent electrode layer 276B; and a third photolayer 270C including a third lower transparent electrode layer 272C, a third upper transparent electrode layer 276C, and a third organic photoelectric layer 274C disposed between the third lower transparent electrode layer 272C and the third upper transparent electrode layer 276C. The first photolayer 270A is disposed over the second surface 201b of the semiconductor substrate 200, the second photolayer 270B is disposed over the first photolayer 270A, and the third photolayer 270C is disposed over the second photolayer 270B.

The image sensor 110 does not include the photoelectric transducer 204 of FIGS. 1 through 6B.

As may be appreciated in view of FIG. 8, the first lower transparent electrode layer 272A, the first organic photoelectric layer 274A, the first upper transparent electrode layer 276A, the second lower transparent electrode layer 272B, the second organic photoelectric layer 274B, the second upper transparent electrode layer 276B, the third lower transparent electrode layer 272C, the third organic photoelectric layer 274C, and the third upper transparent electrode layer 276C are thus sequentially stacked on or over the second surface 201b of the semiconductor substrate 200.

The first cover insulating layer 234 is partially disposed between the first upper transparent electrode layer 276A and the second lower transparent electrode layer 272B, and between the second upper transparent electrode layer 276B and the third lower transparent electrode layer 272C, to prevent the first upper transparent electrode layer 276A and the second lower transparent electrode layer 272B from being electrically connected to each other, and to prevent the second upper transparent electrode layer 276B and the third lower transparent electrode layer 272C from being electrically connected to each other.

The first organic photoelectric layer 274A, the second organic photoelectric layer 274B, and the third organic photoelectric layer 274C may be organic materials which cause a photoelectric change only in, or responsive to, light with different particular wavelengths. For example, the first organic photoelectric layer 274A may cause the photoelectric change only at a first wavelength of red light, the second organic photoelectric layer 274B may cause the photoelectric change only at a second wavelength of green light, and the third organic photoelectric layer 274C may cause the photoelectric change only at a third wavelength of blue light.

The first organic photoelectric layer 274A may include for example a compound of zinc phthalocyanine(ZnPc)/titanyl-oxophthalocyanine(TiOPc)/Alq3, the second organic photoelectric layer 274B may include for example a compound of boronsubphthalocyanine chloride(SubPc), N,—N' dimethyl quinacridone(DMQA), dibutylsubstituted dicyanovinyl-terthiophene(DCV3T), among other materials, and the third organic photoelectric layer 274C may for example include a compound of Coumarin 30:C60/Tris(8-hydroxyquinolinato) aluminium(Alq3). The first organic photoelectric layer 274A, the second organic photoelectric layer 274B, and the third organic photoelectric layer 274C may be other material and are not limited to the above disclosed examples materials.

Each of the first through third lower transparent electrode layers 272A, 272B, and 272C may include a plurality of lower transparent electrode layers that are spaced apart from each other. Each of the first through third upper transparent electrode layers 276A, 276B, and 276C may be integrally formed across the active pixel region APR and the black pixel region BPR.

The first through third lower transparent electrode layers 272A, 272B, and 272C and the first through third upper transparent electrode layers 276A, 276B, and 276C are similar to the lower transparent electrode layer 272 and the upper transparent electrode layer 276 described with reference to FIGS. 1 through 6B, and thus detailed descriptions thereof are here omitted.

The first lower transparent electrode layer 272A is electrically connected to the first and second via plugs 229 and 252. A plurality of the first via plugs 229 and a plurality of second via plugs 252 are shown in FIG. 8. The second lower transparent electrode layer 272B is electrically connected to first connection via plug 254. The third lower transparent electrode layer 272C is electrically connected to second connection via plug 256. A plurality of the first connection via plugs 254 and a plurality of second connection via plugs 256 are shown in FIG. 8.

The first connection via plug 254 penetrates the first upper transparent electrode layer 276A, the first organic photoelectric layer 274A, and the first lower transparent electrode layer 272A to extend toward the semiconductor substrate 200. The second connection via plug 256 penetrates the second upper transparent electrode layer 276B, the second organic photoelectric layer 274B, the second lower transparent electrode layer 272B, the first upper transparent electrode layer 276A, the first organic photoelectric layer 274A, and the first lower transparent electrode layer 272A to extend toward the semiconductor substrate 200. Also, the first connection via plug 254 is not electrically connected to the first lower transparent electrode layer 272A and the first upper transparent electrode layer 276A. The second connection via plug 256 is not electrically connected to the first and second lower transparent electrode layers 272A and 272B, and the first and second upper transparent electrode layers 276A and 276B. Except for these above noted aspects, the first connection via plug 254 and the second connection via plug 256 are similar to the first via plug 229 and the second via plug 252, and thus a detailed description thereof is here omitted.

The first through third upper transparent electrode layers 276A, 276B, and 276C are in contact with each other at a part adjacent to an end adjacent to the first pad 260 and are electrically connected to each other. The connector 292 of the interconnection layer 290 includes the contactor CT2 contacting the third upper transparent electrode layer 276C disposed at the uppermost end among the first through third upper transparent electrode layers 276A, 276B, and 276C.

Thus, the first pad 260 may be electrically connected to the first through third upper transparent electrode layers 276A, 276B, and 276C and may deliver DC power thereto.

Referring to FIG. 9, the image sensor 112 includes a first photolayer 270A including the first lower transparent electrode layer 272A, the first upper transparent electrode layer 276A, and the first organic photoelectric layer 274A disposed between the first lower transparent electrode layer 272A and the first upper transparent electrode layer 276A; a second photolayer 270B including the second lower transparent electrode layer 272B, the second upper transparent electrode layer 276B, and the second organic photoelectric layer 274B disposed between the second lower transparent electrode layer 272B and the second upper transparent electrode layer 276B; and a third photolayer 270C including the third lower transparent electrode layer 272C, the third upper transparent electrode layer 276C, and the third organic photoelectric layer 274C disposed between the third lower transparent electrode layer 272C and the third upper transparent electrode layer 276C. The first photolayer 270A is disposed over the second surface 201b of the semiconductor substrate 200, the second photolayer 270B is disposed over the first photolayer 270A, and the third photolayer 270C is disposed over the second photolayer 270B.

The image sensor 112 does not include the photoelectric transducer 204 of FIGS. 1 through 6B.

In contrast to the image sensor 110 as shown in FIG. 8, the image sensor 112 as shown in FIG. 9 includes the first lower transparent electrode layer 272A, the first organic photoelectric layer 274A, the first upper transparent electrode layer 276A, the second upper transparent electrode layer 276B, the second organic photoelectric layer 274B, the second lower transparent electrode layer 272B, the third lower transparent electrode layer 272C, the third organic photoelectric layer 274C, and the third upper transparent electrode layer 276C sequentially stacked on (or over) the second surface 201b of the semiconductor substrate 200. That is, the sequence of the second upper transparent electrode layer 276B, the second organic photoelectric layer 274B and the second lower transparent electrode layer 272B as shown in FIG. 9 is inverted with respect to the sequence of these layers as shown in FIG. 8. In the image sensor 112 in FIG. 9, the layers of the second photolayer 270B include the second upper transparent electrode layer 276B, the second organic photoelectric layer 274B and the second lower transparent electrode layer 272B sequentially stacked over the first photolayer 270A, while the layers of the first photolayer 270A include the first lower transparent electrode layer 272A, the first organic photoelectric layer 274A and the first upper transparent electrode layer 276A sequentially stacked over the second surface 201b of the semiconductor substrate 200. In the image sensor 112 of FIG. 9, a sequence of the layers of the second photolayer 270B may thus be characterized as inverted with respect to a sequence of the layers of the first photolayer 270A and the third photolayer 270C.

The first cover insulating layer 234 is partially disposed between the first upper transparent electrode layer 276A and the second upper transparent electrode layer 276B, and between the second lower transparent electrode layer 272B and the third lower transparent electrode layer 272C, to prevent the first upper transparent electrode layer 276A and the second upper transparent electrode layer 276B from being electrically connected to each other, and to prevent the second lower transparent electrode layer 272B and the third lower transparent electrode layer 272C from being electrically connected to each other.

Each of the first through third lower transparent electrode layers 272A, 272B, and 272C include a plurality of lower transparent electrode layers that are spaced apart from each other. Each of the first through third upper transparent electrode layers 276A, 276B, and 276C are integrally formed across the active pixel region APR and the black pixel region BPR.

The second lower transparent electrode layer 272B is electrically connected to the first connection via plug 254. The third lower transparent electrode layer 272C is electrically connected to the second connection via plug 256.

The first connection via plug 254 penetrates the second organic photoelectric layer 274B, the second lower transparent electrode layer 272B, the second upper transparent electrode layer 276B, the first organic photoelectric layer 274A, and the first lower transparent electrode layer 272A to extend toward the semiconductor substrate 200. The second connection via plug 256 penetrates the second lower transparent electrode layer 272B, the second organic photoelectric layer 274B, the second upper transparent electrode layer 276B, the first upper transparent electrode layer 276A, the first organic photoelectric layer 274A, and the first lower transparent electrode layer 272A to extend toward the semiconductor substrate 200.

The first through third upper transparent electrode layers 276A, 276B, and 276C are in contact with each other at a part adjacent to an end adjacent to the first pad 260 and are electrically connected to each other. The connector 292 of the interconnection layer 290 includes the contactor CT2 contacting the third upper transparent electrode layer 276C disposed at the uppermost end among the first upper transparent electrode layer 276A, the second upper transparent electrode layer 276B, and the third upper transparent electrode layer 276C.

Thus, the first pad 260 may be electrically connected to the first upper transparent electrode layer 276A, the second upper transparent electrode layer 276B, and the third upper transparent electrode layer 276C and may deliver DC power thereto.

Referring to FIG. 10, the image sensor 114 includes various layers disposed in a manner similar to the image sensor 112 shown in FIG. 9. The image sensor 114 includes a first photolayer 270A including the first lower transparent electrode layer 272A, a shared transparent electrode layer 276M, and the first organic photoelectric layer 274A disposed between the first lower transparent electrode layer 272A and the shared transparent electrode layer 276M; a second photolayer 270B including the second lower transparent electrode layer 272B, the shared transparent electrode layer 276M, and the second organic photoelectric layer 274B disposed between the shared transparent electrode layer 276M and the second lower transparent electrode layer 272B; and a third photolayer 270C including the third lower transparent electrode layer 272C, the third upper transparent electrode layer 276C, and the third organic photoelectric layer 274C disposed between the third lower transparent electrode layer 272C and the third upper transparent electrode layer 276C.

The image sensor 114 of FIG. 10 is similar to the image sensor 112 of FIG. 9, except that the image sensor 114 of FIG. 10 includes the shared transparent electrode layer 276M, in which the first upper transparent electrode layer 276A and the second upper transparent electrode layer 276B of the image sensor 112 of FIG. 9 are integrally formed, and thus a detailed description thereof will not be repeated here.

The shared transparent electrode layer 276M and the third upper transparent electrode layer 276C in FIG. 10 are in contact with each other at a part adjacent to an end adjacent to the first pad 260 and are electrically connected to each other. The connector 292 of the interconnection layer 290 includes the contactor CT2 contacting the third upper transparent electrode layer 276C disposed at an upper end between the shared transparent electrode layer 276M and the third upper transparent electrode layer 276C.

Thus, the first pad 260 is electrically connected to the shared transparent electrode layer 276M and the third upper transparent electrode layer 276C and may deliver DC power thereto.

It should be understood that the image sensors 110, 112, and 114 of FIGS. 8 through 10 have variously modified plan layouts, like the image sensors 100, 100a, 102, 104a, and 104b of FIGS. 2A, 2B, 4, 6A, and 6B, and thus illustrations and descriptions thereof are omitted here.

Figure 11A:
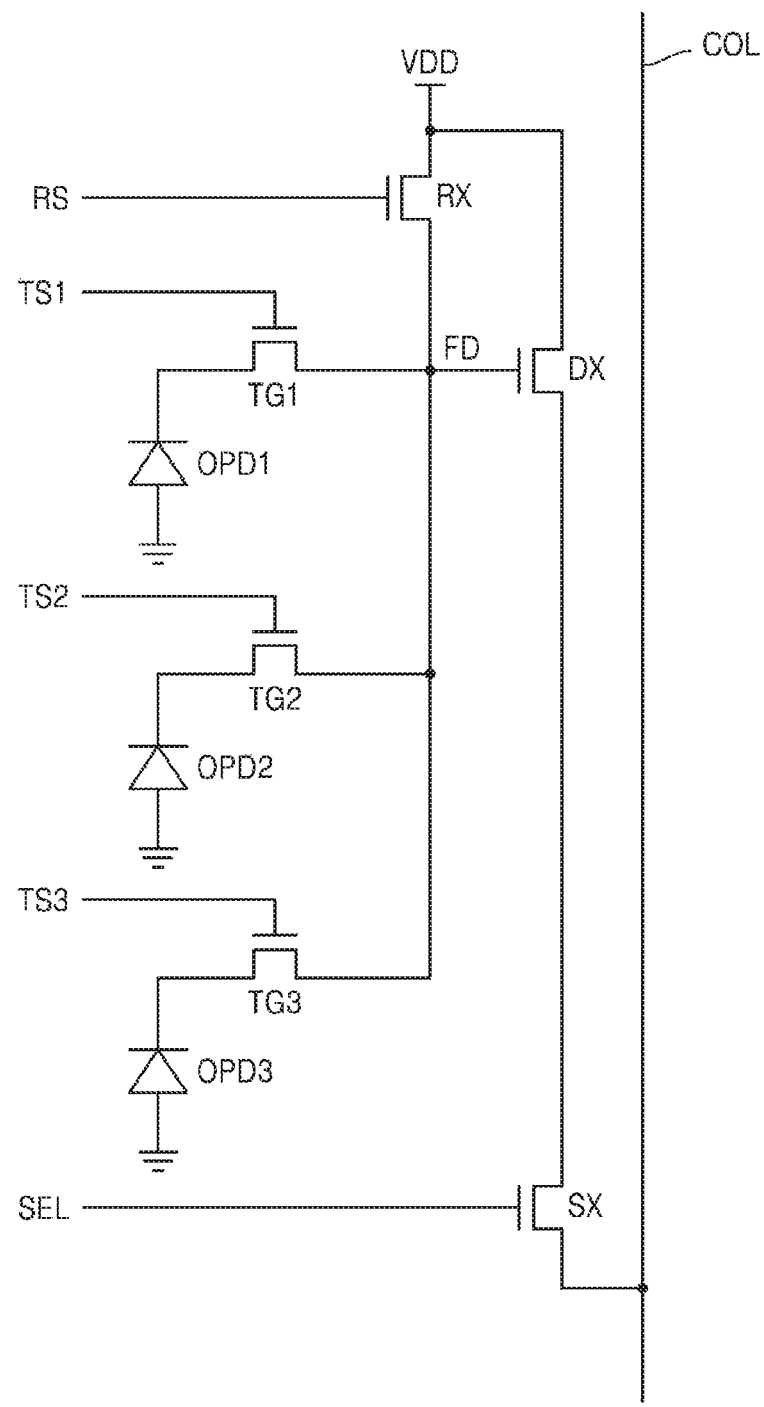
FIG. 11A illustrates a readout circuit diagram of an image sensor according to another embodiment of the inventive concepts.
Figure 11B:
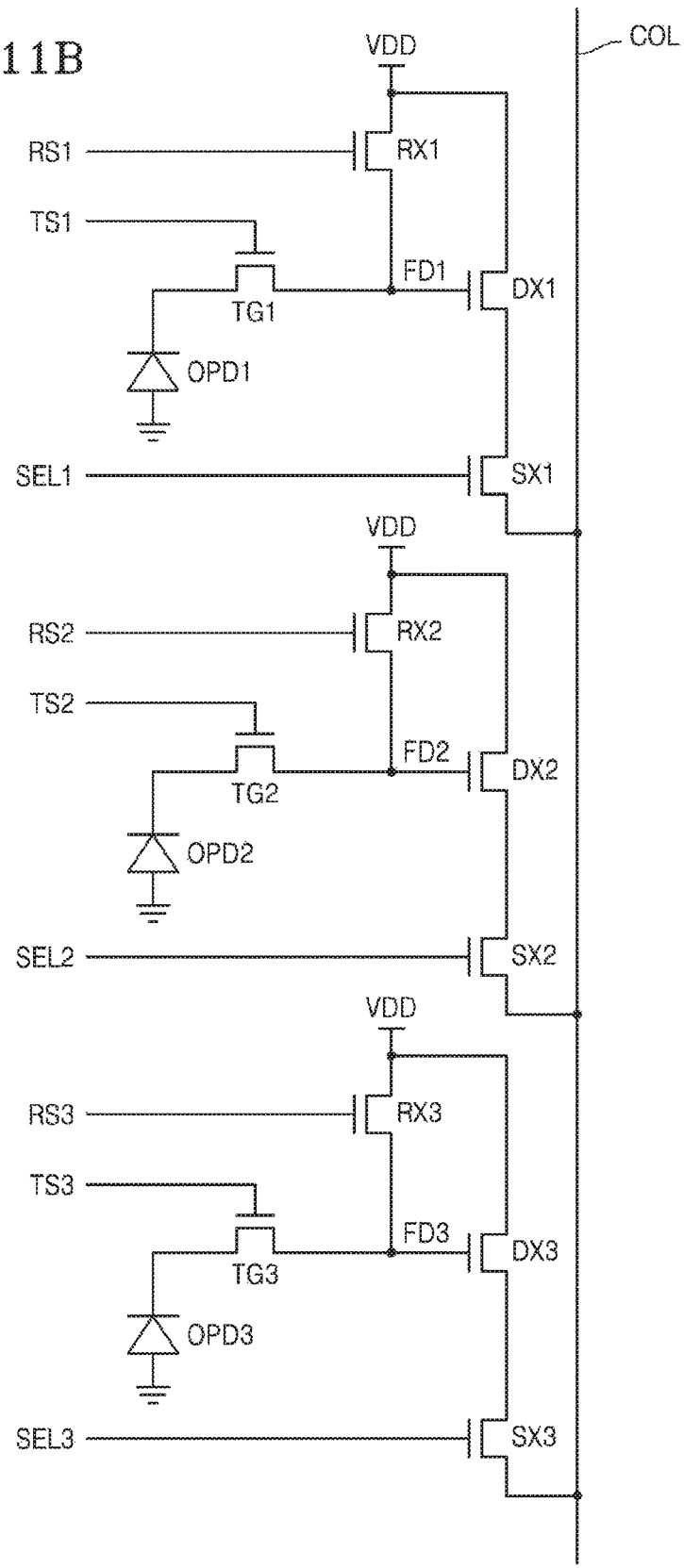
FIG. 11B illustrates a readout circuit diagram of an image sensor according to another embodiment of the inventive concepts.

FIG. 11A illustrates a readout circuit diagram of an image sensor according to another embodiment of the inventive concepts. FIG. 11B illustrates a readout circuit diagram of an image sensor according to another embodiment of the inventive concepts.

Referring to FIG. 11A, OPD1, OPD2, and OPD3 share the single floating diffusion region FD. When viewed from a pixel, a green pixel, a red pixel, and a blue pixel share the single floating diffusion region FD. For example, OPD1, OPD2, and OPD3 may be respectively configured by the organic photoelectric layers 274A, 274B, and 274C of FIGS. 8 through 10.

The readout circuit includes the three transmission transistors TG1, TG2, and TG3, the floating diffusion region FD, the reset transistor RX, the drive transistor DX, and the selection transistor SX.

The first transmission transistor TG1 operates in response to the first transmission control signal TS1. The second transmission transistor TG2 operates in response to the second transmission control signal TS2. A third transmission transistor TG3 operates in response to a third transmission control signal TS3. The reset transistor RX operates in response to the reset control signal RS. The selection transistor SX operates in response to the selection signal SEL.

When an activation time of the first transmission control signal TS1, an activation time of the second transmission control signal TS2, and an activation time of the third transmission control signal TS3 are appropriately controlled, signals corresponding to electric charges generated by OPD1, OPD2, and OPD3 may be transmitted to the column line COL according to operations of the respective transistors DX and SX.

Referring to FIG. 11B, a first readout circuit which reads out electric charges generated by OPD1, a second readout circuit which reads out electric charges generated by OPD2, and a third readout circuit which reads out electric charges generated by OPD3 are mutually separated. When viewed from a pixel, a green pixel and a red pixel are mutually separated.

The first readout circuit includes the first transmission transistor TG1, the first floating diffusion region FD1, the first reset transistor RX1, the first drive transistor DX1, and the first selection transistor SX1.

The first transmission transistor TG1 operates in response to the first transmission control signal TS1. The first reset transistor RX1 operates in response to the first reset control signal RS1. The first selection transistor SX1 operates in response to the first selection signal SEL1.

The second readout circuit includes the second transmission transistor TG2, the second floating diffusion region FD2, the second reset transistor RX2, the second drive transistor DX2, and the second selection transistor SX2.

The second transmission transistor TG2 operates in response to the second transmission control signal TS2. The second reset transistor RX2 operates in response to the second reset control signal RS2. The second selection transistor SX2 operates in response to the second selection signal SEL2.

The third readout circuit includes a third transmission transistor TG3, a third floating diffusion region FD3, a third reset transistor RX3, a third drive transistor DX3, and a third selection transistor SX3.

The third transmission transistor TG3 operates in response to a third transmission control signal TS3. The third reset transistor RX3 operates in response to a third reset control signal RS3. The third selection transistor SX3 operates in response to a third selection signal SEL3.

When an activation time of the first transmission control signal TS1, an activation time of the second transmission control signal TS2, and an activation time of the third transmission control signal TS3 are appropriately controlled, signals corresponding to electric charges generated by OPD1, OPD2, and OPD3 may be transmitted to the column line COL according to operations of the respective transistors DX1 and SX1, DX2 and SX2, and DX3 and SX3.

Figure 12:
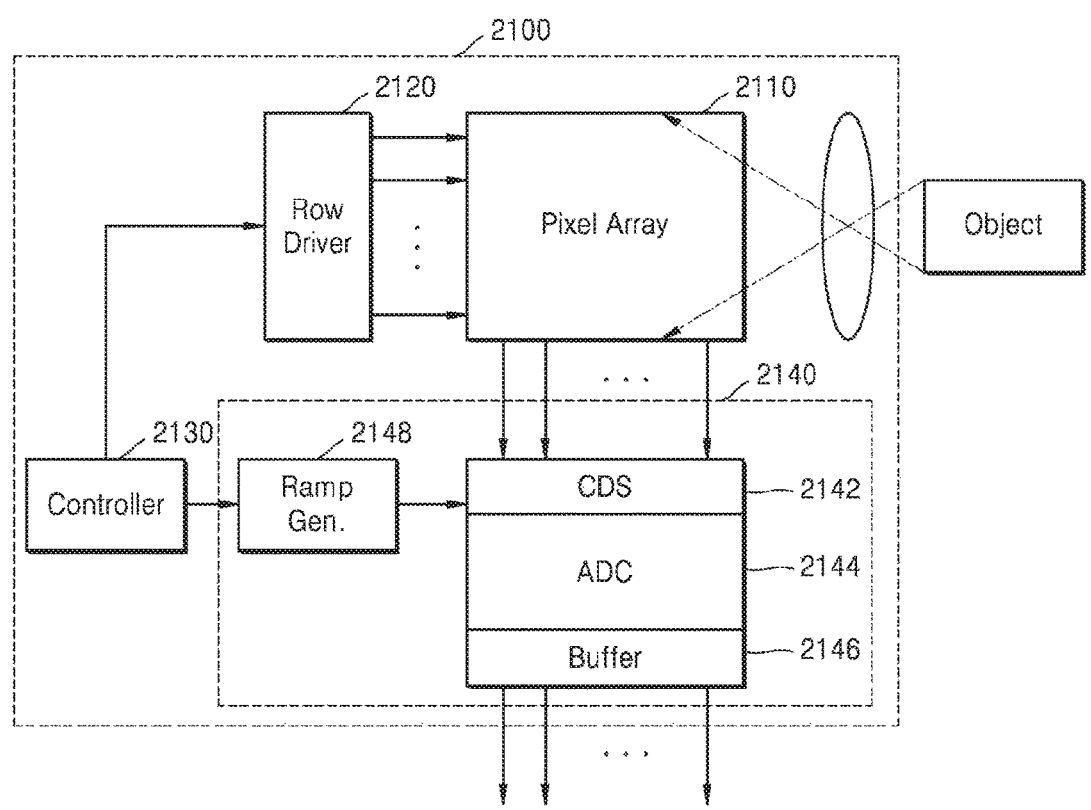
FIG. 12 illustrates a block diagram of a configuration of an image sensor according to an embodiment of the inventive concepts.

FIG. 12 illustrates a block diagram of a configuration of an image sensor according to an embodiment of the inventive concepts.

Referring to FIG. 12, the image sensor 2100 includes a pixel array 2110, a controller 2130, a row driver 2120, and a pixel signal processor 2140. The image sensor 2100 includes at least one of the image sensors 100, 100a, 102, 104, 104a, 104b, 110, 112, and 114 described with reference to FIGS. 1 through 11B.

The pixel array 2110 may include a plurality of unit pixels two-dimensionally arranged. The unit pixel may include a photoelectric transducer. The photoelectric transducer may generate charges by absorbing light. An electric signal (an output voltage) according to the generated charges may be provided to the pixel signal processor 2140 through a vertical signal line. The unit pixels included in the pixel array 2110 may provide output voltage one at a time by a row. Accordingly, the unit pixels in one row of the pixel array 2110 may be activated at the same time by a selection signal output by the row driver 2120. The unit pixels in a selected row may provide output voltages according to absorbed light to an output line of a corresponding column.

The controller 2130 may control the row driver 2120 to allow the pixel array 2110 to accumulate charges by absorbing light, to temporarily store the accumulated charges, and to output an electric signal according to the stored charges from the pixel array 2110 to the outside. Also, the controller 2130 may control the pixel signal processor 2140 to measure the output voltage provided by the pixel array 2110.

The pixel signal processor 2140 may include a correlated double sampler (CDS) 2142, an analog-digital converter (ADC) 2144, and a buffer 2146. The CDS 2142 may sample and hold the output voltage provided by the pixel array 2110. The CDS 2142 may double sample a level of a noise and a level according to a generated output voltage, and may output a level corresponding to a difference therebetween. Also, the CDS 2142 may receive a ramp signal generated by a ramp signal generator 2148 and compare the ramp signals, and thereby a comparison result may be output.

The ADC 2144 may convert an analog signal corresponding to the level received from the CDS 2142 into a digital signal. The buffer 2146 may latch the digital signal. The latched signal is sequentially output from the image sensor 2100 to the outside to be transferred to an image processor (not shown).

While the inventive concepts have been particularly shown and described with reference to embodiments thereof, it should be understood that various changes in form and details may be made therein without departing from the spirit and scope of the following claims.

What is claimed is:
1. An image sensor comprising:
a semiconductor substrate comprising an active pixel region in which a plurality of active pixels are disposed and a power delivery region in which a pad is disposed on the semiconductor substrate;
a plurality of first transparent electrode layers disposed over the semiconductor substrate and respectively corresponding to the plurality of active pixels;
a second transparent electrode layer integrally formed across the plurality of active pixels;
an organic photoelectric layer disposed between the plurality of first transparent electrode layers and the second transparent electrode layer; and
an interconnection layer located at a level that is the same as or higher than an upper surface of the pad with respect to an upper main surface of the semiconductor substrate,
the interconnection layer extending from the pad to the second transparent electrode layer, and comprising a connector electrically connecting the pad and the second transparent electrode layer,
wherein the pad is located at a level lower than the plurality of first transparent electrode layers,
wherein the semiconductor substrate further comprises a black pixel region that surrounds the active pixel region and in which a plurality of black pixels are disposed, the black pixel region is between the active pixel region and the power delivery region, and
wherein the interconnection layer further comprises a cover covering the black pixel region.

2. The image sensor of claim 1, wherein the second transparent electrode layer comprises an extender extending into the power delivery region toward the pad, the second transparent electrode layer is integrally formed across a part of the power delivery region, the black pixel region, and the active pixel region.

3. The image sensor of claim 2, wherein the connector extends from the pad to the extender.

4. The image sensor of claim 3, wherein the extender comprises a first part in contact with the connector and a second part disposed between a part of the second transparent electrode layer disposed in the black pixel region and the first part, the second part is not in contact with the connector,
wherein a first extension length of the first part is greater than a second extension length of the second part in a direction from an edge of the black pixel region to the pad.

5. The image sensor of claim 2, wherein the cover extends from the extender to the black pixel region.

6. The image sensor of claim 1, wherein the cover has a ring shape extending to surround the active pixel region and covering the plurality of black pixels.

7. The image sensor of claim 1, wherein the upper surface of the pad is located above the upper main surface of the semiconductor substrate, and
wherein the interconnection layer is located above the upper main surface of the semiconductor substrate.

8. The image sensor of claim 1, wherein the power delivery region is disposed to surround the active pixel region.

9. The image sensor of claim 1, wherein the pad is a DC pad to which DC power is delivered from outside.

10. An image sensor comprising:
a semiconductor substrate comprising an active pixel region in which a plurality of active pixels are disposed, a black pixel region in which a plurality of black pixels are disposed and that surrounds the active pixel region, and a power delivery region in which a plurality of pads including a DC pad are disposed and that surrounds the black pixel region;
a plurality of first transparent electrode layers disposed over the semiconductor substrate and respectively corresponding to the plurality of active pixels;
a second transparent electrode layer integrally formed across a part of the power delivery region, the black pixel region, and the active pixel region;
an organic photoelectric layer disposed between the plurality of first transparent electrode layers and the second transparent electrode layer; and
an interconnection layer located at a level higher than an upper main surface of the semiconductor substrate, and extending from the DC pad to the second transparent electrode layer,
the interconnection layer comprising a connector electrically connecting the DC pad and the second transparent electrode layer, and a cover covering the black pixel region.

11. The image sensor of claim 10, wherein upper surfaces of the plurality of pads are lower than lower surfaces of the plurality of first transparent electrode layers with respect to the upper main surface of the semiconductor substrate.

12. The image sensor of claim 11, wherein the semiconductor substrate comprises a recessed space in the upper main surface of the semiconductor substrate,
wherein the plurality of pads are disposed in the recessed space and the upper surfaces of the plurality of pads are located above the upper main surface of the semiconductor substrate.

13. The image sensor of claim 10, wherein the plurality of pads comprise a plurality of DC pads, and the interconnection layer comprises a plurality of connectors electrically connecting the DC pads and the second transparent electrode layer,
wherein at least respective ones of the plurality of connectors are adjacent to each of a plurality of sides forming an outer edge of the black pixel region.

14. The image sensor of claim 10, wherein the cover comprises an open space corresponding to the active pixel region.

15. An image sensor comprising:
a semiconductor substrate comprising an active pixel region in which a plurality of active pixels are disposed and a power delivery region in which a pad is disposed;
a plurality of first transparent electrode layers disposed over the semiconductor substrate and respectively corresponding to the plurality of active pixels;
a second transparent electrode layer integrally formed across the plurality of active pixels;
an organic photoelectric layer disposed between the plurality of first transparent electrode layers and the second transparent electrode layer; and
an interconnection layer located at a level that is the same as or higher than an upper surface of the pad with respect to an upper main surface of the semiconductor substrate,
the interconnection layer extending from the pad to the second transparent electrode layer, and comprising a connector electrically connecting the pad and the second transparent electrode layer, and
wherein the semiconductor substrate further comprises a black pixel region that surrounds the active pixel region and in which a plurality of black pixels are disposed, the black pixel region is between the active pixel region and the power delivery region, and
wherein the interconnection layer further comprises a cover covering the black pixel region.

16. The image sensor of claim 15, wherein the second transparent electrode layer comprises an extender extending into the power delivery region toward the pad, the second transparent electrode layer is integrally formed across a part of the power delivery region, the black pixel region, and the active pixel region.

17. The image sensor of claim 16, wherein the connector extends from the pad to the extender.

18. The image sensor of claim 17, wherein the extender comprises a first part in contact with the connector and a second part disposed between a part of the second transparent electrode layer disposed in the black pixel region and the first part, the second part is not in contact with the connector,
wherein a first extension length of the first part is greater than a second extension length of the second part in a direction from an edge of the black pixel region to the pad.

19. The image sensor of claim 15, wherein the cover has a ring shape extending to surround the active pixel region and covering the plurality of black pixels.

* * * * *